United States Patent [19]
Kimura et al.

[11] Patent Number: 5,380,674
[45] Date of Patent: Jan. 10, 1995

[54] METHOD OF FABRICATING SEMICONDUCTOR MEMORY DEVICE HAVING TRENCH CAPACITOR AND ELECTRICAL CONTACT THERETO

[75] Inventors: Shin'ichiro Kimura; Takeshi Sakata, both of Kunitachi; Kiyoo Itoh, Higashi-Kurume, all of Japan

[73] Assignee: Hitachi, Ltd., Tokyo, Japan

[21] Appl. No.: 962,509

[22] Filed: Oct. 16, 1992

[30] Foreign Application Priority Data

Oct. 18, 1991 [JP] Japan .................................. 3-270711

[51] Int. Cl.⁶ ...................... H01L 21/70; H01L 27/00
[52] U.S. Cl. .......................................... 437/52; 437/60; 437/919
[58] Field of Search ................ 437/919, 47, 52, 60

[56] References Cited

U.S. PATENT DOCUMENTS

| | | | |
|---|---|---|---|
| 4,873,205 | 10/1989 | Critchlow et al. | 437/200 |
| 4,877,750 | 10/1989 | Okumura | 437/52 |
| 5,234,854 | 8/1993 | An et al. | 437/52 |
| 5,234,856 | 8/1993 | Gonzalez | 437/47 |
| 5,273,928 | 12/1993 | Tani | 437/52 |

*Primary Examiner*—Olik Chaudhuri
*Assistant Examiner*—H. Jey Tsai
*Attorney, Agent, or Firm*—Antonelli, Terry, Stout & Kraus

[57] ABSTRACT

A semiconductor memory device where trench capacitors for charge storage are arranged respectively to symmetric positions with respect to a gate electrode of a field effect transistor.

Since electrodes of the capacitor are connected to source or drain of the field effect transistor in self alignment, a required area is small and a fabricating method is quite simple in comparison with the prior art.

18 Claims, 23 Drawing Sheets

METHOD OF FABRICATING SEMICONDUCTOR MEMORY DEVICE HAVING TRENCH CAPACITOR AND ELECTRICAL CONTACT THERETO

BACKGROUND OF THE INVENTION

The present invention relates to semiconductor devices and a method for fabricating the same, and more specifically relates to a semiconductor device having a trench capacitor and a method capable of fabricating the semiconductor device easily.

As known well, in the prior art, dynamic random access memory (DRAM) has realized improvement of the integration degree being four times in the three years, and the mass production of the DRAM of 4 mega bits has been already carried out and the development directed to the mass production of the DRAM of 16 mega bits is being advanced.

Such high integration of the DRAM has been achieved by reducing the element size, but due to decrease of the charge storage capacity attendant on the miniaturization, disadvantages such as decrease of signal-to-noise ratio or change "1" to "0" due to α-particle irradiation, are actualized, and it becomes difficult to maintain the reliability.

Therefore in the present, as a memory cell capable of increasing the charge storage capacitor, the mainstream of cells of 4 mega bits and so forth is in a stacked cell where a part of the charge storage capacitor is stacked on a switching transistor or a field isolation oxide, or in a trench type cell where a deep trench is formed on a substrate and a charge storage capacitor is formed to a side wall of the trench.

Further, the trial manufacture of the DRAM of 16 mega bits or 64 mega bits is being tried, using a three-dimensional cell structure where such cells are arranged in the three dimensions up and down and the self-align process. However, if the area of the memory cell is made small along the trend up to now, the cell area becomes about 0.5 square microns in the DRAM of 256 mega bits and becomes about 0.15 square microns in the DRAM of 1 giga bit. Consequently, even if the above-mentioned three-dimensional capacitor cell is used, sufficient storage capacitor cannot be obtained and it is difficult to reduce the cell area.

A memory cell is constituted by minimum unit of a capacitor for storing charge, bit lines for supplying charge to the capacitor, and word lines for controlling the flow of charge. Therefore, a very small memory cell can be fabricated in comparison with other semiconductor memory devices.

FIG. 5 is a sectional view showing a semiconductor memory device having a trench type capacitor in the prior art. A trench capacitor cell of this structure is disclosed in Japanese patent application laid-open No. 136559/1988. Electrodes to constitute a charge storage capacitor are composed of a storage capacitor electrode contacting with a diffusion layer of a switching transistor and an opposite electrode opposed to the storage capacitor electrode. This structure is characterized in that a plate 16 being an opposite electrode is formed within a substrate self-alignedly. That is, a bottom portion of a silicon dioxide film 8 to cover the inner wall of the trench is removed selectively, and a polycrystalline silicon film to be used as a plate is formed within the trench and subjected to patterning into a desired form, and then impurity being different from the substrate in the conductivity type is diffused through the polycrystalline silicon. Since trenches are closely aggregated within the substrate, the impurity diffused layers are connected to each other by the thermal process in usual temperature of about 900° C. and a meshed plate is formed.

In order to realize this structure, however, complicated processes are required such that at first, a silicon dioxide film on the bottom of the trench is removed, and a polycrystalline silicon 9 within the trench is dug down as shown in FIG. 5, and only a part of the side wall of the silicon dioxide film 8 is removed, in order to connect a diffusion layer 5 of a switching transistor with a polycrystalline silicon 11 filling the inside of the trench. Also since a junction is produced within the substrate, leak current may occur between the plate and the substrate. Thus the semiconductor memory device of trench type as shown in FIG. 5 has a structure which is not always suitable for miniaturization, because its fabricating method is complicated.

In FIG. 5, numeral 1 designates a semiconductor substrate, numeral 2 designates a gate silicon dioxide film of a switching transistor, numeral 3 designates a gate electrode of a switching transistor, numeral 4 designates a silicon dioxide film, numeral 5 designates a diffusion layer, numeral 6 designates a side wall silicon dioxide film of a switching transistor, numeral 7 designates a trench, numeral 8 designates a trench side wall silicon dioxide film, numeral 9 designates a plate electrode within a trench, numeral 10 designates a capacitor insulation film, numeral 11 designates a capacitor storage electrode contacting with a diffusion layer of a switching transistor, numeral 13 designates an interlayer insulation film, numeral 14 designates a bit line, numeral 18 designates a polycrystalline silicon to connect a diffusion layer with a polycrystalline silicon within a trench on a surface of a substrate, and numeral 19 designates a polycrystalline silicon film through which a bit line and a diffusion layer are connected, respectively.

The most serious problem in the structure of the above-mentioned memory cell is caused by that the polycrystalline silicon 11 filling the inside of the trench and the diffusion layer of the switching transistor must be connected electrically. That is, a part of upper side of the silicon dioxide film 8 to cover the side wall of the trench must be removed. In this case, since the upper side of the trench silicon dioxide film 8 contacting with a field isolation oxide 15 must be protected, a mask pattern must be used. As a result, alignment tolerance is necessary between the gate electrode 3 of the switching transistor and the trench 7. Also impurity is diffused from the polycrystalline silicon 11 into the substrate 1 through the part where the trench silicon dioxide film 8 is removed. In order that the impurity does not adversely affect the characteristics of the switching transistor, the distance between the gate electrode and the trench cannot be made so small and the tolerance must be considered.

Due to such problems, it is difficult that the trench cell shown in FIG. 5 is further miniaturized.

Not only the trench cell but also that of other type, although the cell can be constituted by the minimum area in structure in the dynamic random access memory, reduction of the area of the memory cell is limited by such alignment tolerance, and the connecting part between the bit line and the diffusion layer, and the word line arrangement on the field isolation oxide 15 in the cell of so-called folded bit-line structure as shown in FIG. 5.

SUMMARY OF THE INVENTION

In order to solve these problems, the present invention forms a structure as a first embodiment shown in FIG. 1. This structure is characterized in that a trench capacitor is arranged to the symmetric position each other to a gate electrode 3 of a switching transistor. Consequently, being different from a dynamic random access memory in the prior art, charge is transferred from a capacitor close to a bit line 14 through a switching transistor in sequence, and it is stored from a capacitor arranged at the farthest position with respect to the bit line. Method of transferring such charge in sequence is disclosed in TAM6.2, ISSCC 1991. However, since a semiconductor memory device uses a memory cell called "CROWN" type, the structure is complicated and it is quite difficult to form this with high accuracy.

On the other hand, in the present invention, since trench type capacitors are used as capacitors and these trench type capacitors are arranged to position in symmetry each other to a switching transistor, large advantages other than those in the prior art are obtained as follows.

Since a number of capacitors are connected thereby connection parts between the bit line 14 and the diffusion layer can be decreased, the cell area becomes small corresponding to the number of capacitors to be connected. Also, a polycrystalline silicon 9 within the trench connected electrically to a diffusion layer of a switching transistor is contacted with the diffusion layer of two neighboring transistors being different from the memory device in the prior art shown in FIG. 5, thereby a special mask pattern is not required so as to form the connection part. Also as hereinafter described in detail, a side wall silicon dioxide film 8 formed within the trench is projected from the surface of the substrate 1 upward, thereby connection between the polycrystalline silicon 9 within the trench and the diffusion layer possessed by the transistor is carried out in the minimum area and self-alignedly. Even if the side wall silicon dioxide film 8 is not projected, the electric connection can be carried out, of course, in the minimum area and self-alignedly in similar manner. However, in this case, particularly when the side wall silicon dioxide film 8 is positioned to the inside with respect to the surface of the substrate 1, the area of the diffusion layer is increased. Increase of the area of the diffusion layer causes deterioration of characteristics, such as increase of the leak current or deterioration of soft-error immunity, and therefore it is not preferable but does not deteriorate the characteristics in the structure of the present invention.

Also as shown in FIG. 1, a polycrystalline silicon 11 being one electrode of a capacitor is separated along the word line 3 in the parallel direction to the word line 3. The separation of the polycrystalline silicon 11 is also carried out self-alignedly utilizing the height of the word line 3. The point that the polycrystalline silicon 11 can be separated self-alignedly is quite different from the case using a stacked cell where a stacked capacitor is arranged also on a word line.

In such a structure, since the domain number of the contact part between the bit line and the diffusion layer becomes small in response to the number of capacitors to be connected, the cell area is reduced. For example, the four capacitors are connected, thereby the cell area can be reduced to about 60% in comparison with the cell in the folded bit-line structure in the prior art. Also as above described, since the polycrystalline silicon 9 within the trench is connected to the diffusion layers on both lateral sides of the capacitor, the connection can be carried out self-alignedly. This is because there is no process of exposing only a part of the side wall silicon dioxide film 8, being different from the trench cell in the prior art shown in FIG. 5. Consequently, the electric connection can be carried out self-alignedly utilizing the two word lines putting the capacitor therebetween. Since this connection is carried out only through the narrow gap formed by the part projecting on the substrate among the side wall silicon dioxide film 8 of the trench and the side wall silicon dioxide film 6 of the gate electrode, the area of the diffusion layer can be made small. This is effective for the improvement of the performance, such as reduction of the leak current or the improvement of the soft-error immunity.

In the memory cell shown in FIG. 1, the plate electrode 11 is separated along the word line 3, and this enables variation of the potential of the plate in unit of several capacitors. Consequently, many advantages, such as reduction of the consumption power, and improvement of the noise immunity due to increase of the durability to activate a bit-line, can be realized. Further in FIG. 1, a silicon nitride film 12 is formed between the word line 3 and the plate electrode 11, and this is to open the contact of the bit line self-alignedly as hereinafter described, and the etching of an interlayer oxide 13 is stopped by this silicon nitride film and the contact is opened on the gap of the word line being narrower than the contact hole of the bit line.

DETAILED DESCRIPTION OF THE PREFERRED EMBODIMENTS

Embodiment 1

Figure 1:
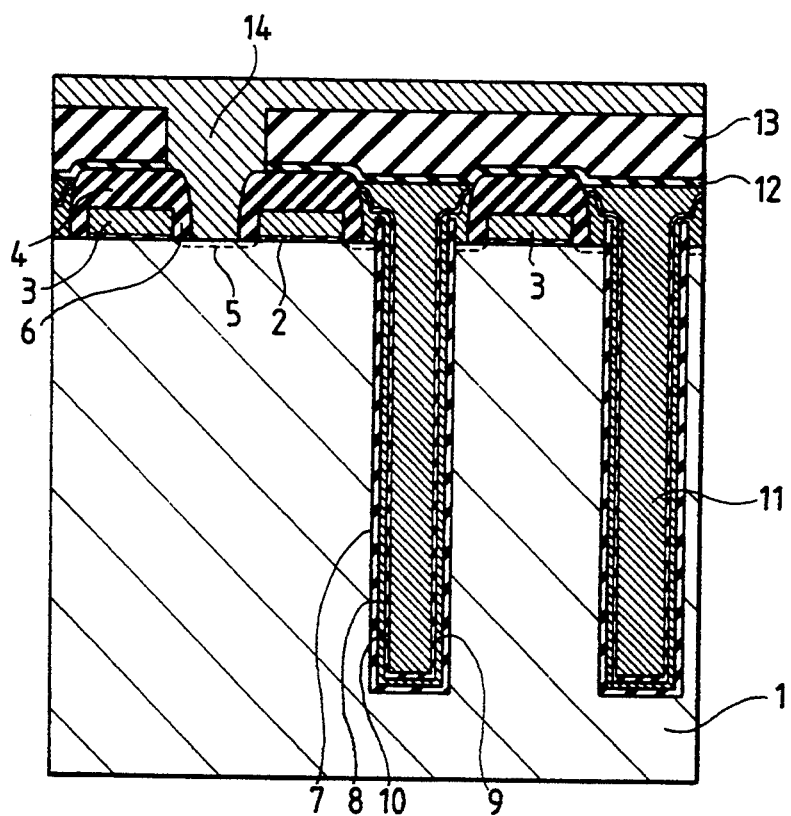
FIGS. 1 to 4 are sectional views showing different embodiments of the invention respectively.
Figure 2:
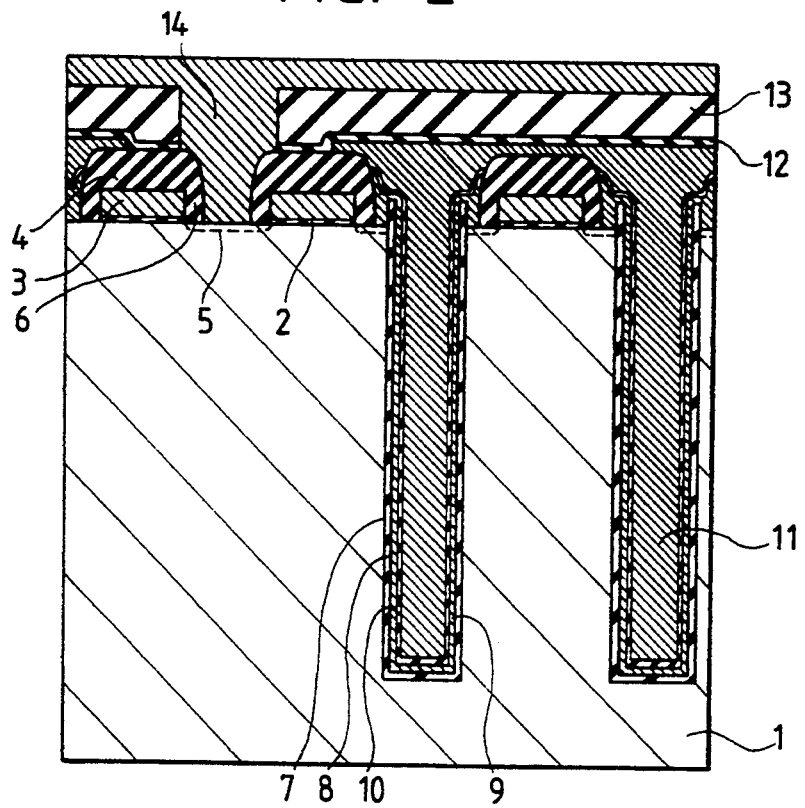

FIG. 2 shows an example of a sectional view of a semiconductor memory device of the present invention. This structure is essentially the same as that shown in FIG. 1. However, it is different in that a plate electrode 11 is not separated along a word line, and several capacitors are covered commonly. That is, this structure shows a memory cell where the above-mentioned capacitors are connected continuously. Drive is carried out in sequence from a word line close to a contact of a bit line 14 and charge is transferred between the capacitors. As above described, since the bit line contact can be commonly used by the plurality of capacitors in this structure, the cell area becomes small corresponding to this.

Embodiment 2

Figure 3:
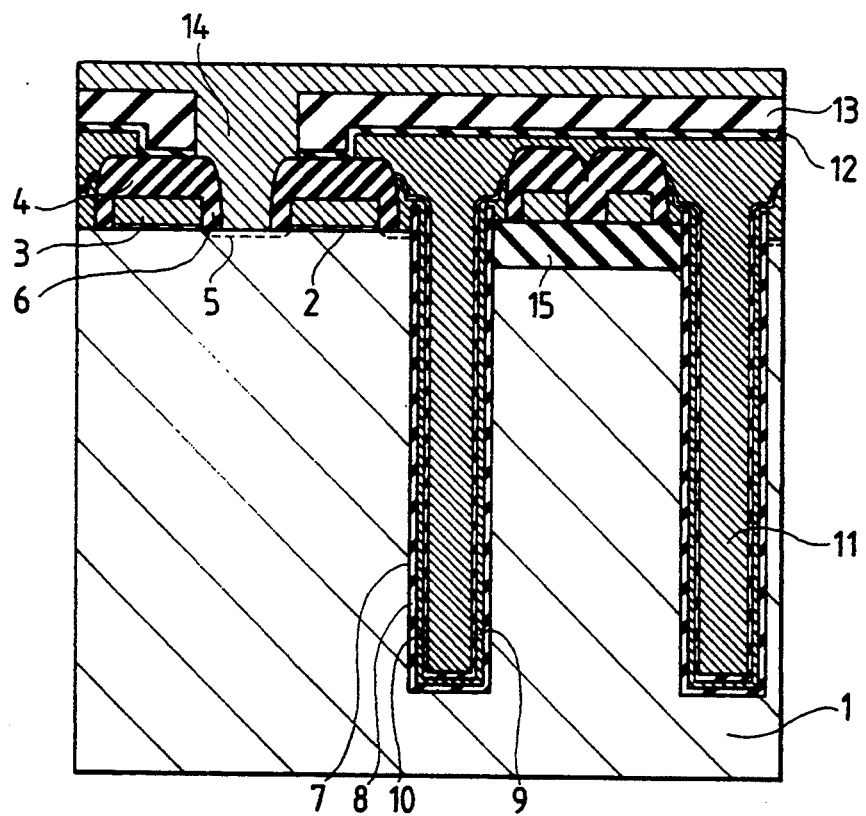

FIG. 3 shows an example where a memory cell of the present invention is applied to a cell of folded bit-line structure in the prior art. In the cell of folded bit-line structure, a word line 3 is arranged on a field isolation oxide 15. Consequently, different from the embodiments shown in FIGS. 1, 2, one side of an intratrench polycrystalline silicon 9 is on the field isolation oxide 15 and does not contact with a diffusion layer within the substrate. However, also in this structure, a trench capacitor of symmetric structure of the present invention can be produced. A plate electrode 11 covers a plurality of capacitors, and the capacitors cannot be separated self-alignedly being different from the structure shown in FIG. 1. This is because the capacitors are arranged alternately as feature of the folded bit-line system.

Embodiment 3

Figure 4:
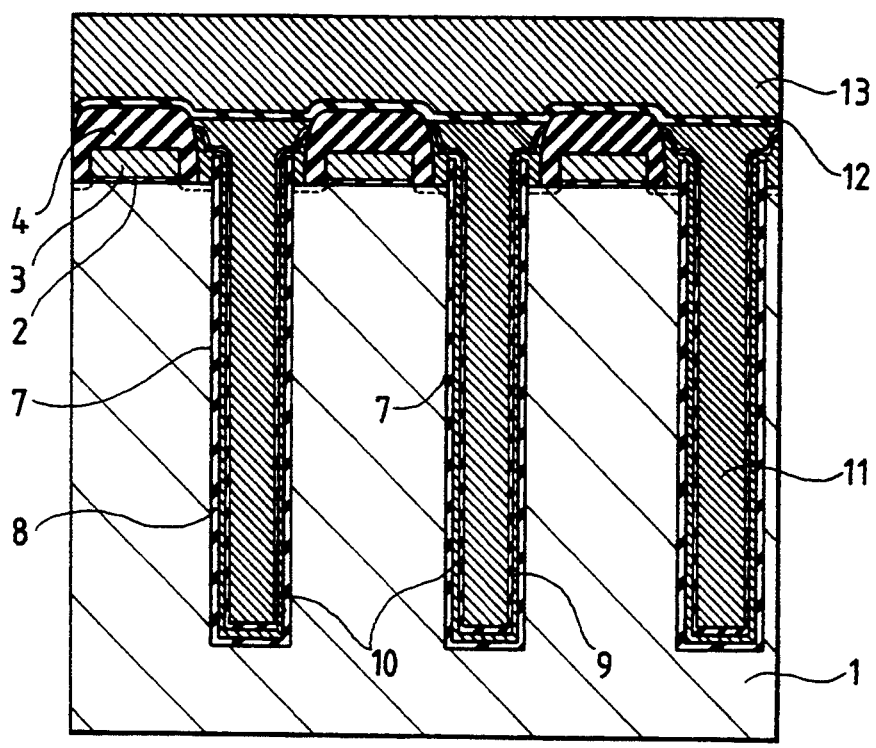
Figure 5:
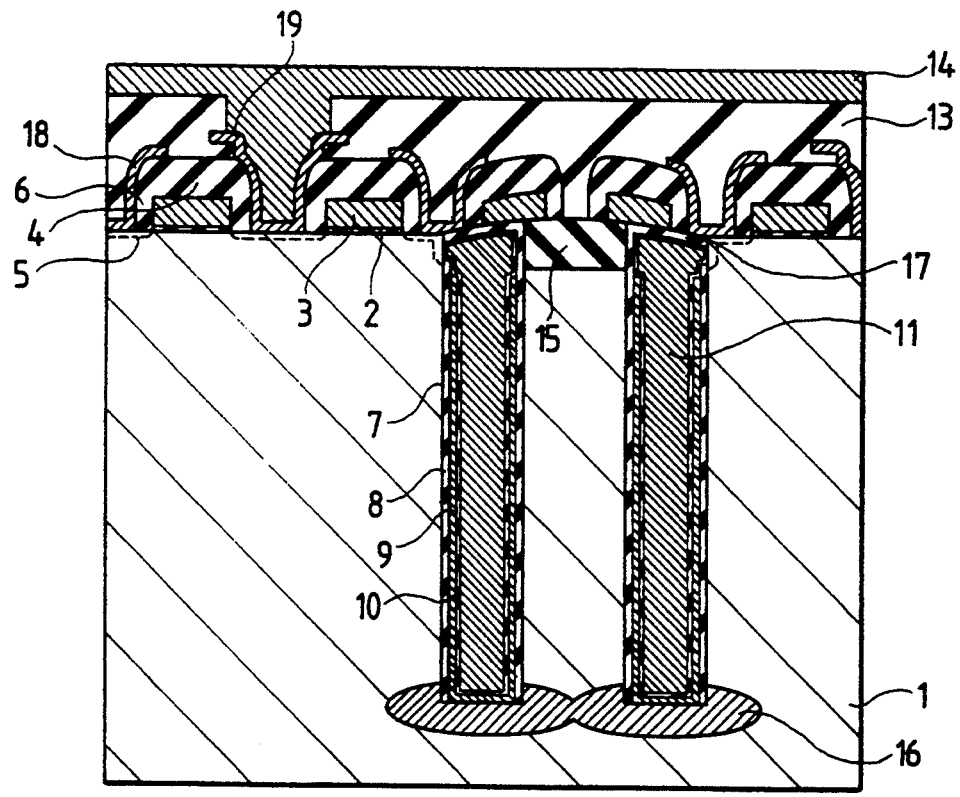
FIG. 5 is a sectional view showing a semiconductor memory device having a trench capacitor in the prior art.

In FIG. 4, symmetry capacitors and a switching transistor in the present invention are arranged only continuously. In this structure, junction system between a gate electrode group 3 and a plate electrode group 11 and phase in the case of giving the potential to these are changed, thereby the charge stored to the capacitor can be transferred.

This is called backet-bridged-device, and when one word line and one of plates adjacent to this are connected electrically and potential with different phase is given to every other line, the charge can be transferred. As described in detail in Japanese patent publication No. 8556/1982 being developing form of this example, the multi-phase clock system enables improvement of the transfer speed and the high speed operation. Thus by combining the symmetry capacitor and the transistor in the present invention, the semiconductor memory device of charge transfer type can be constituted. Furthermore, since this structure is the most simple structure, in comparison by the same design rule, the cell area can be made about a half in comparison with the cell of folded bit-line structure in the prior art. Also as another feature of the structure, it may be mentioned that the bit line becomes unnecessary. In the dynamic random access memory in the prior art, only the charge stored in the capacitor must drive the bit line of relatively large capacity. Therefore, in order to carry out the normal operation, ratio of the capacity of the bit line and the charge storage capacitor must be the prescribed value or more, irrespective of the integration degree of the memory. In the memory device of charge transfer type, however, using the charge transferred to the final stage, the switching transistor can be driven and the charge can be supplied from the electrode to the input stage. Since the charge required for driving the transistor is very little in comparison with the charge required for driving the bit line, the capacity of the charge storage capacitor can be made small in comparison with the memory cell in the prior art. This means that the trench need not be made so deep, and it is clear that the memory cell can be easily produced. When the trench comparable with the cell in the prior art is formed, since the charge quantity necessary for one bit can be made small, plural bits of information can be stored in one capacitor.

Figure 9:
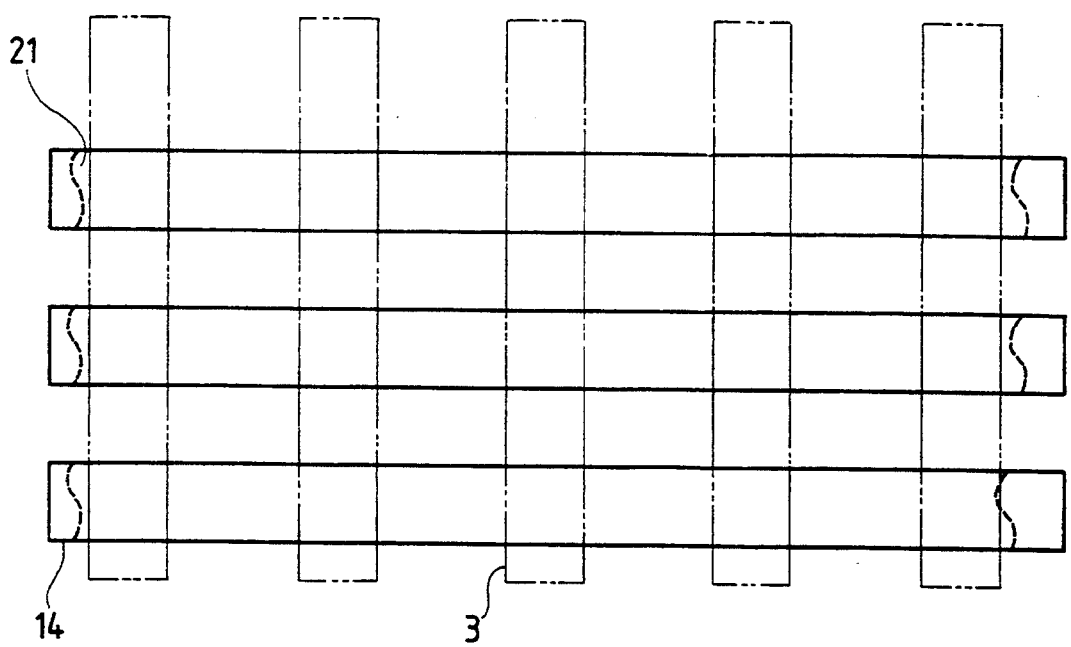

FIG. 9 shows the main part of the memory device of charge transfer type shown in FIG. 4. The field isolation domain 21 and the word electrode 3 are orthogonal. Since the capacitor connected to the transistor can be produced entirely in self alignment, the strict mask align process is not necessary to form the main part of such memory device. However, in the input section of the charge, the output section and the end of the word electrode, it is needless to say that the mask is necessary to carry out various connections or to remove the deposit film attendant on the self alignment.

Embodiment 4

Figure 6:
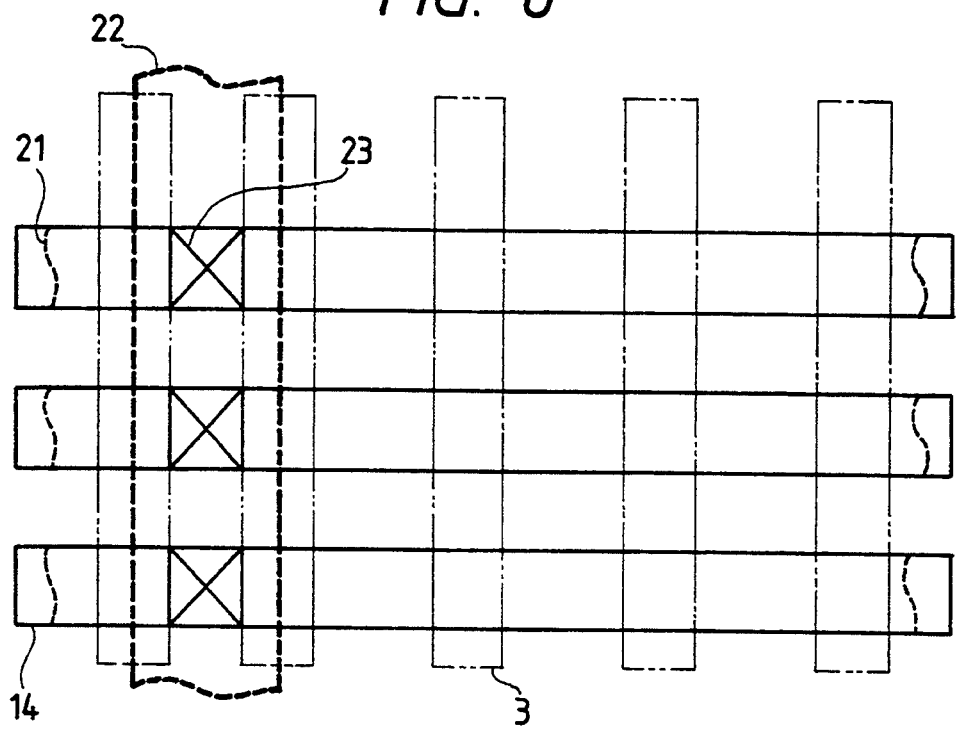
FIGS. 6 to 9 are plan views showing different embodiments of the invention respectively.

FIG. 6 is a plan view of the semiconductor memory device shown in FIG. 1. In FIG. 6, numeral 21 designates a pattern to form the field isolation domain, and if the silicon nitride film is processed to this pattern and the substrate is put in the oxidation atmosphere, the silicon dioxide film is formed only on the domain which is not covered by the silicon nitride film and the field isolation oxide 21 is formed. Next, if the silicon nitride film being a mask for selective oxidation is removed, the surface of the substrate being the channel domain of the switching transistor is exposed. The gate silicon dioxide film of the transistor is grown on the surface of the substrate, and the gate electrode 3 is formed using the gate electrode pattern. Thus the field isolation domain and the word electrode are arranged in intersection. The trench capacitor forming method as hereinafter described is in that the field isolation oxide and the word electrode are used as a mask and the trench capacitor is formed self-alignedly by digging a trench on the substrate. Therefore, a special mask is not required to form the trench. Also since separation of the plate electrode along the word line can be carried out self-alignedly, the mask need not be used. However, since the deposit film formed during carrying out the self alignment remains in the domain where the bit line contact 23 is formed, a mask 22 must be used to remove the deposit film selectively. Since similar state occurs in the end position of the word electrode, it is needless to say that another mask is necessary.

Embodiment 5

Figure 7:
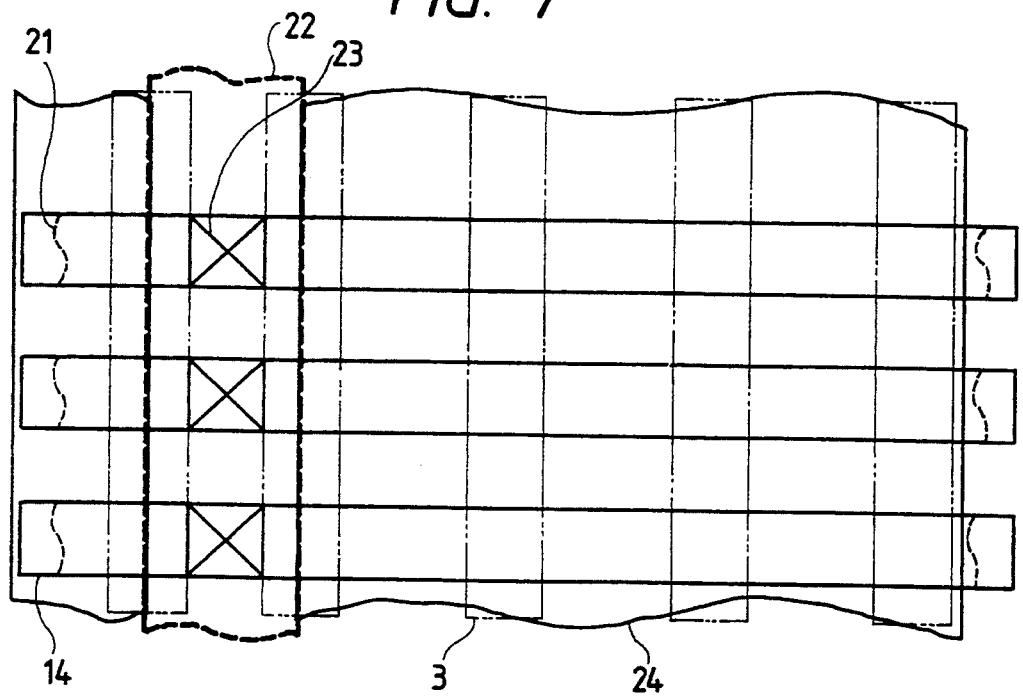

FIG. 7 shows an example in similar structure to that of FIG. 6, where the plate electrode is separated not in self alignment, but using a mask 24. Thereby the semiconductor memory device by the embodiment shown in FIG. 2 is formed.

Embodiment 6

Figure 8:
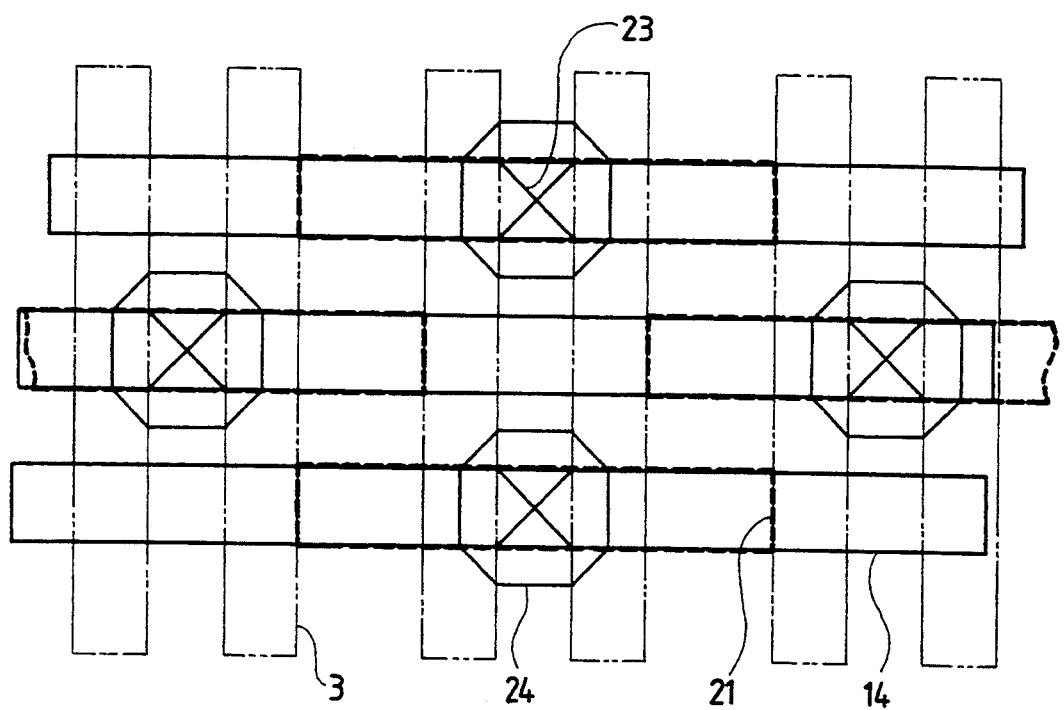

FIG. 8 shows a plan view where a symmetry trench cell according to the invention is applied to a cell in which the field isolation domain pattern 2 is constituted by a folded data structure in the prior art. Therefore, the memory cell area is large in comparison with the two cases as above described. Also, since one bit line contact 23 must be provided for two cells, a plate electrode pattern 24 has a structure with a window as shown in FIG. 8.

Embodiment 7

Fabricating method of a semiconductor memory device with structure shown in FIG. 1 will be described.

Figure 10:
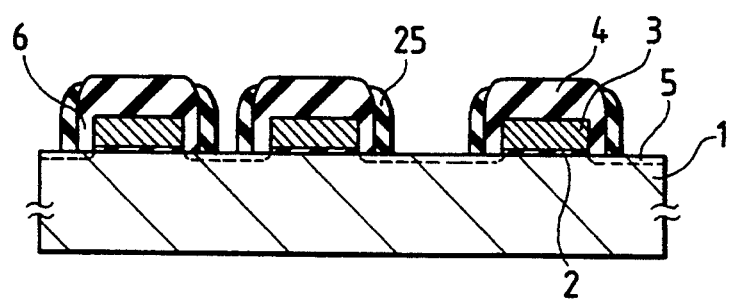
FIGS. 10 to 29 are process diagrams explaining an example of fabricating method of a semiconductor memory device of the invention.

First, as shown in FIG. 10, a gate silicon dioxide film 2 is formed on a semiconductor substrate 1 by known thermal oxidation method. Concretely, temperature 850° C. is held in the atmosphere including oxygen and steam, and a silicon dioxide film of about 5 nm is formed. Although not shown in FIG. 1, it is needless to say that processes such as setting of impurity distribution of the substrate or growth of a field isolation oxide are carried out before oxidation. And then a silicon dioxide film 4 on a gate electrode film is used as a mask and a gate electrode 3 is formed, and further its side wall only is covered by a side wall silicon dioxide film 6. The side wall silicon dioxide film 6 can be formed using all-area forming of an oxide film and anisotropic dry etching as known well. Also before forming the side wall silicon dioxide film 6, a diffusion layer 5 being different from the substrate 1 in the conductivity type is formed. In this case, polycrystalline silicon including impurity of n type is used in the gate electrode 3. Also thickness of the silicon dioxide film 4 on the gate electrode 3 is about 250 nm, and thickness of the side wall silicon dioxide film 6 is about 50 nm. And then if a silicon nitride film 25 is further deposited by known CVD and the above-mentioned anisotropic etching is carried out to this, a side wall film by the silicon nitride film 25 is formed on the outside of the side wall silicon dioxide film 6. Thickness of the silicon nitride film 25 is about 50 nm.

Figure 11:
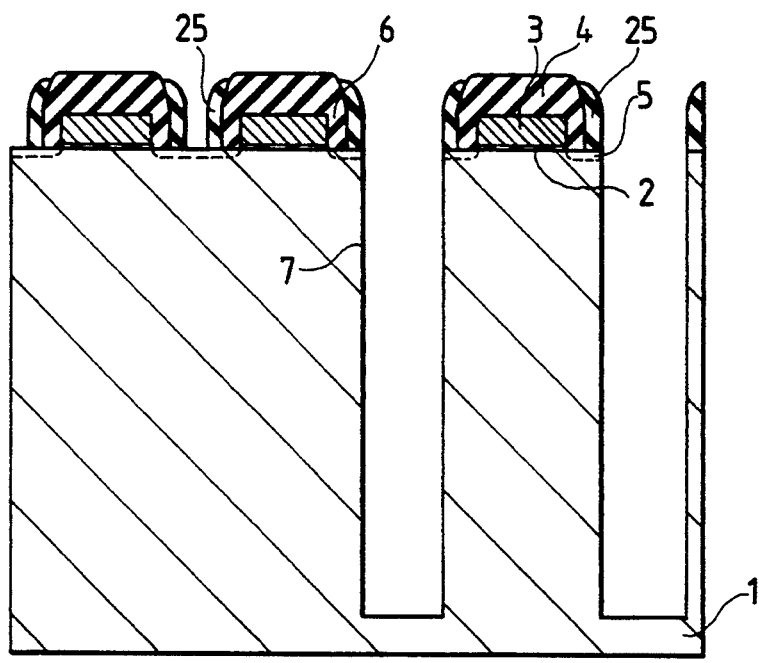

Next, as shown in FIG. 11, the silicon dioxide film 4 to cover the side wall silicon dioxide film 6, the silicon nitride film 25 and the gate electrode 3 is used, and although not shown in FIG. 11, a field isolation oxide is used as a mask, and a trench to form a trench capacitor on the semiconductor substrate 1 is formed. In the processing of the trench, low-temperature dry etching method is used where temperature of the substrate 1 is held to the liquid nitrogen temperature and etching is carried out. Using the low-temperature dry etching, since reaction of the etching gas and the side wall of the trench is suppressed, trench size shift in the lateral direction can be suppressed. Also selectivity of etching of the substrate 1 and the mask material can be essentially improved. In this embodiment, the trench with depth of about 2 microns is formed. Width of an opening of the trench is made 0.3 microns. Using the low-temperature dry etching method, the etching selection ratio between the substrate 1 and the mask material can be increased, but the insulation film is still etched to some degree. Therefore the thickness of the insulation film is previously set so as to withstand the degree of the etching in this case and the subsequent self-align process.

Figure 12:
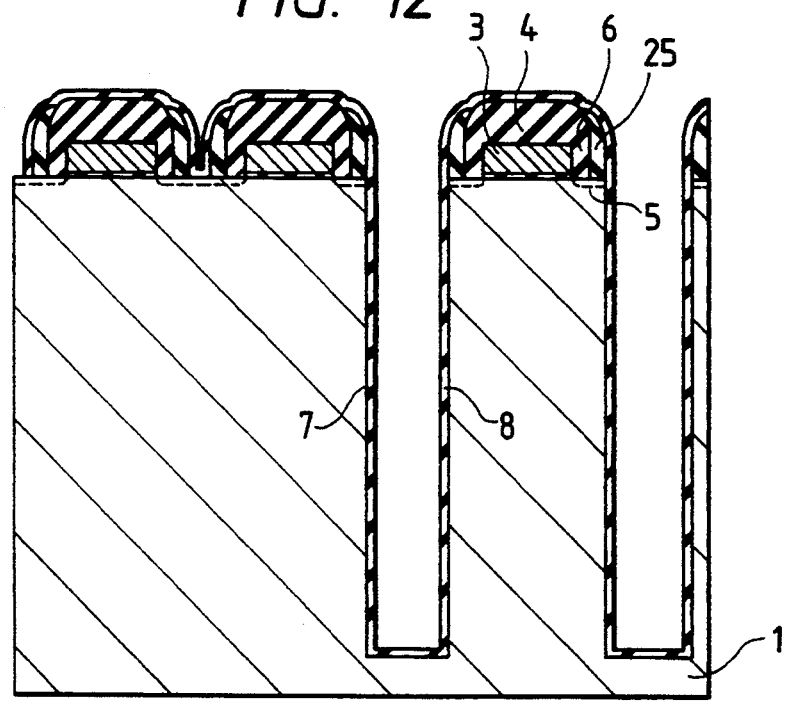

Contamination or damage layer remaining in the trench is removed by processing of washing or oxidation, and then the silicon dioxide film 8 to cover the inner wall of the trench is deposited by chemical vapor deposition as shown in FIG. 12. The film thickness is 20 nm, but if the low-pressure chemical vapor deposition as known well is used, the oxide film can be deposited uniformly even to the inner wall of such narrow trench.

Figure 13:
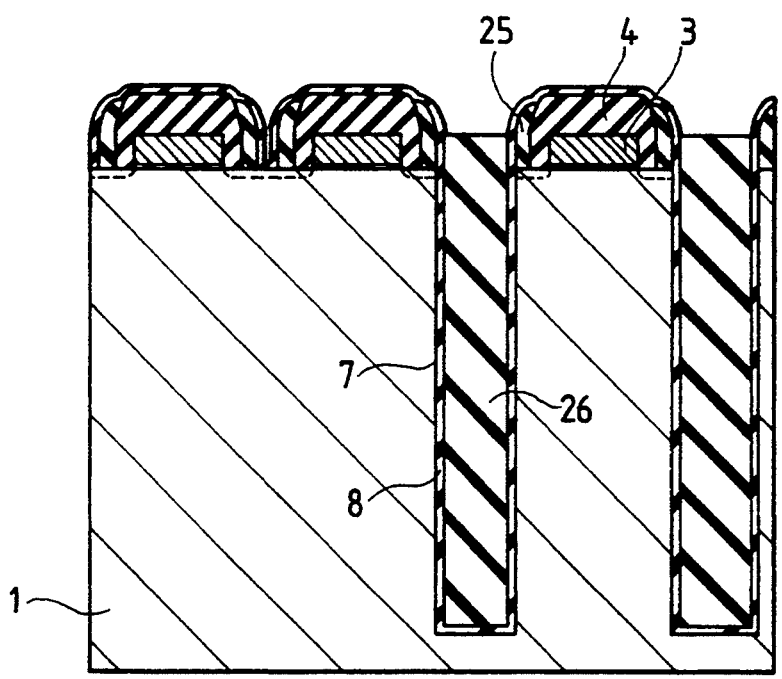

Next, as shown in FIG. 13, an organic film 26 such as a resist is formed to the whole surface using spin coat method, and then the organic film 26 is subjected to the all-area anisotropic etching and the silicon dioxide film 8 on the word line 3 is exposed. Dry etching by oxygen plasma is used in the all-area etching. Thereby a part of the silicon dioxide film 8 deposited by the process shown in FIG. 12 is exposed. In this case, also as shown in FIG. 13, the organic film remains also in the neighboring word line domain in which the bit line contact is formed.

Figure 14:
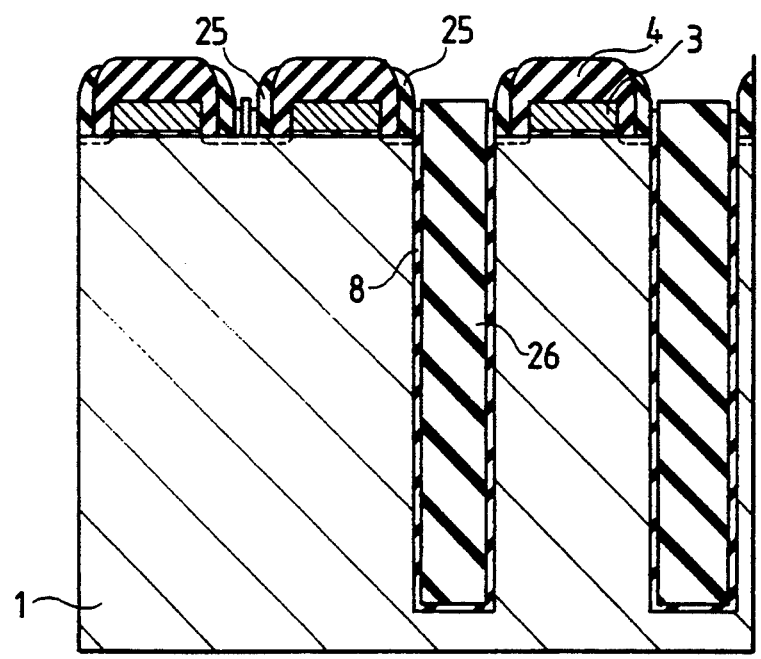

Further, if the dry etching is carried out to remove the silicon dioxide film 8 exposed in the process of FIG. 13, a part of the silicon dioxide film 4 and the side wall silicon nitride film 25 on the word line 3 is exposed as shown in FIG. 14. Among the silicon dioxide film 8 formed on the inner wall of the trench, a part exposed on the surface of the substrate remains. In this case, since the silicon dioxide film remains in the domain where the bit line contact is formed as above described, only this part must be removed in the later process. In this embodiment, the side wall silicon dioxide film 8 is projected upward from the surface of the substrate 1, but even if it is not projected, since there is the side wall silicon nitride film 25 of the word line 3, distance corresponding to the thickness of the silicon nitride film 25 can be held between the word line 3 and the trench. Thereby connection between the diffusion layer and one electrode of the capacitor by self alignment as hereinafter described can be carried out similarly to the case that the side wall silicon dioxide film 8 is projected. In such constitution, however, since the area of the diffusion layer is widened and the increase of the leak current or the deterioration of the soft-error immunity may occur, it is better that a part of the silicon dioxide film 8 is projected upward from the surface of the substrate 1.

Figure 15:
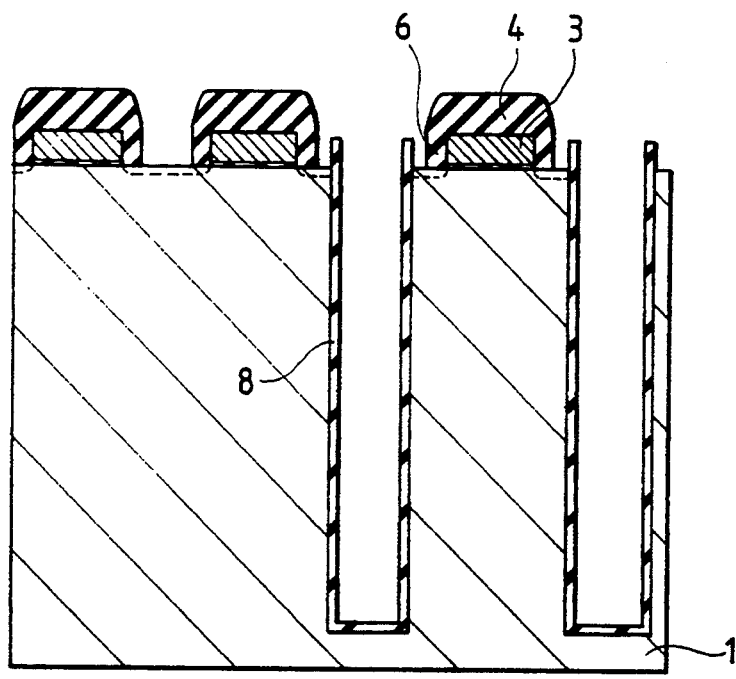

Next, while the organic film 26 is still filled in the trench, only the side wall silicon nitride film 25 is selectively removed. This etching is carried out by dry etching under relatively isotropic condition. In this case, since the silicon dioxide film remains in the domain in which the bit line contact is formed as above described, while the organic film is still filled in the trench, the resist film is coated again and only the bit line contact part is only disposed and the silicon dioxide film is removed selectively. Since a part with the word line distance being narrow exists much other than the bit line contact part, the silicon dioxide film is removed using a mask to cover the trench part only. After finishing this processing, the resist film filling the trench is removed in the oxygen plasma and the structure shown in FIG. 15 is formed.

Figure 16:
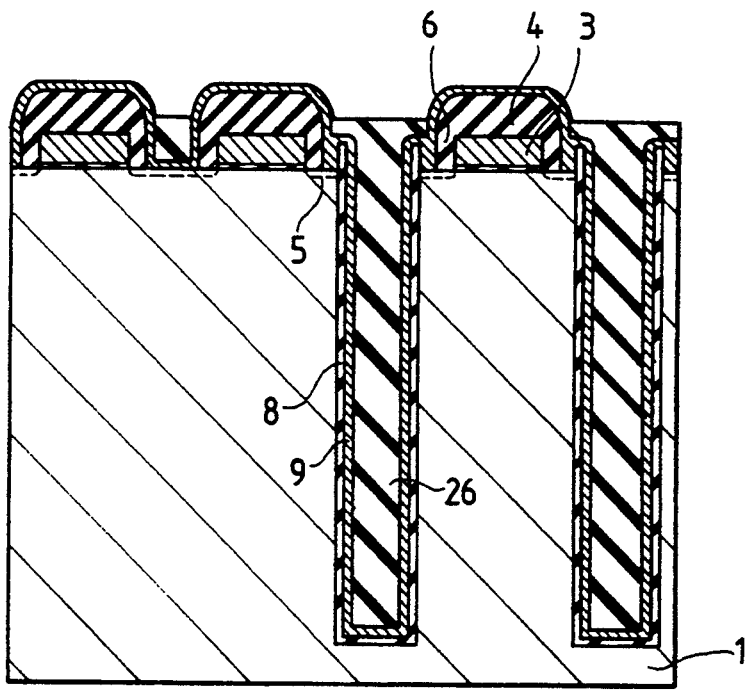

Next, after washing the inside of the trench, as shown in FIG. 16, polycrystalline silicon including impurity is deposited to thickness of about 20 nm on the whole surface and the polycrystalline silicon film 9 is formed. In the polycrystalline silicon, phosphorus as impurity is doped because semiconductor of p type including boron is used as a substrate, and if the substrate is n type, polycrystalline silicon including boron is used. Using the low-pressure chemical vapor deposition, polycrystalline silicon can be uniformly deposited even in such narrow domain. Also in this case, the polycrystalline silicon enters also into the gap produced by the side wall silicon dioxide film 6 of the word electrode 3 and the projecting portion of the trench inner wall silicon dioxide film 8, and the polycrystalline silicon film and the diffusion layer are connected self-alignedly. Further, after the organic film is coated to the whole surface, if the organic film is subjected to the all-area etching and the polycrystalline silicon film 9 on the word line 3 is exposed and only the exposed portion is selectively removed, the polycrystalline silicon film 9 is separated along the word line 3 self-alignedly.

Figure 17:
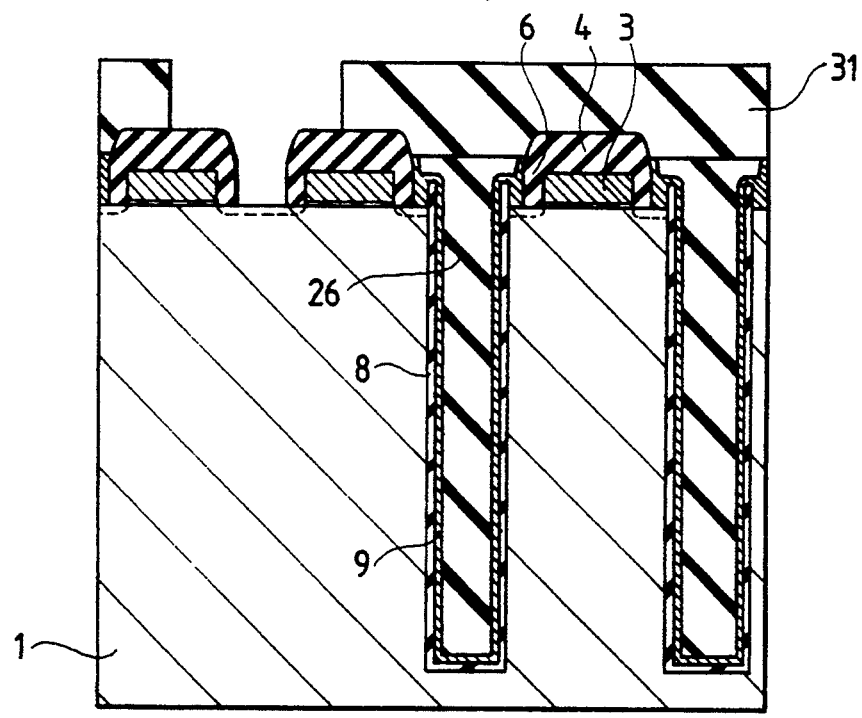
Figure 18:
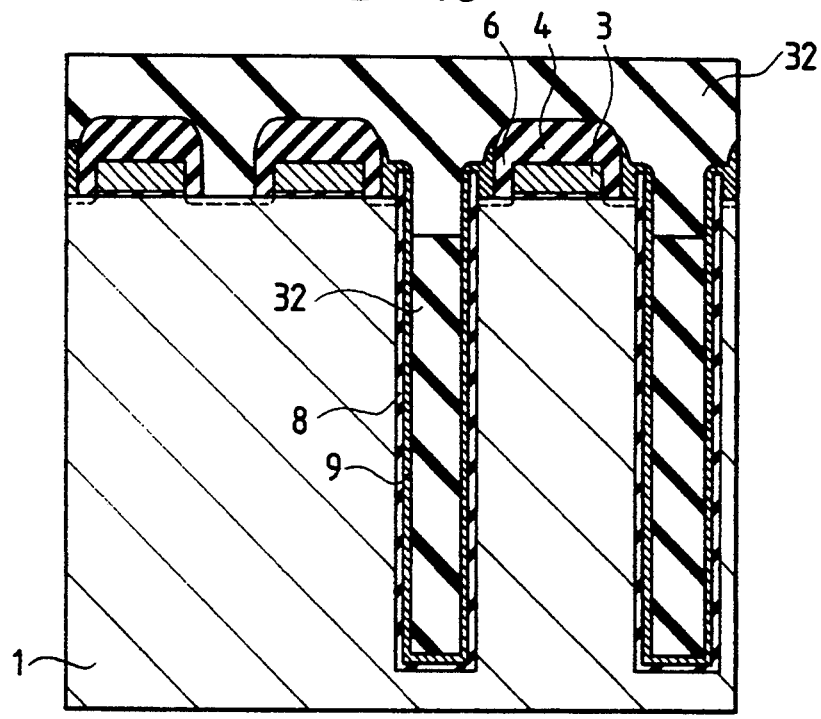

Also in this case, since polycrystalline silicon remains in the bit line contact part, as shown in FIG. 18, a resist mask 31 to open this part only is formed, and the exposed part of the polycrystalline silicon is removed as shown in FIG. 17.

Next, a resist 32 is coated on the whole surface as shown in FIG. 18. The resist 32 is to separate the polycrystalline silicon film filling the trench in the vertical direction to the word line as hereinafter described.

Figure 19:
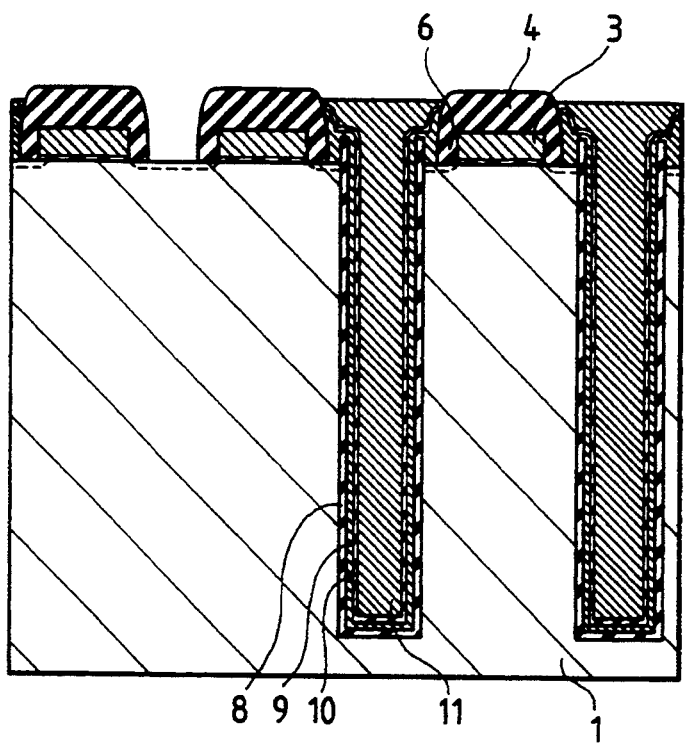

Further, the surface of the polycrystalline silicon film 9 formed on the inner surface of the trench is washed, and then the capacitor insulation film 10 is formed. Therefore the silicon nitride film being thin is first deposited. Since defect such as pinhole exists on the silicon nitride film, if the surface is oxidized, not only the surface of the silicon nitride film is oxidized but also the polycrystalline silicon is oxidized through the defect. Consequently, the defect is restored and the capacitor insulation film 10 with high reliability can be formed. In this embodiment, the stacked film with $SiO_2$ equivalent thickness of 4 nm is grown. Thereby the charge storage capacitor becomes about 20 femto-farads. Next, polycrystalline silicon including impurity is deposited and fills the inside of the trench, and the plate electrode 11 is formed. Further as shown in FIG. 19, photoetching with a mask is used, and the plate electrode 11 in the domain with the bit line contact part being opened is removed selectively. In this case, since the capacitor insulation film 10 exists on the surface of the substrate, the capacitor insulation film 10 acts as a stopper for the processing of the plate electrode 11 and advance of the etching is stopped.

Figure 20:
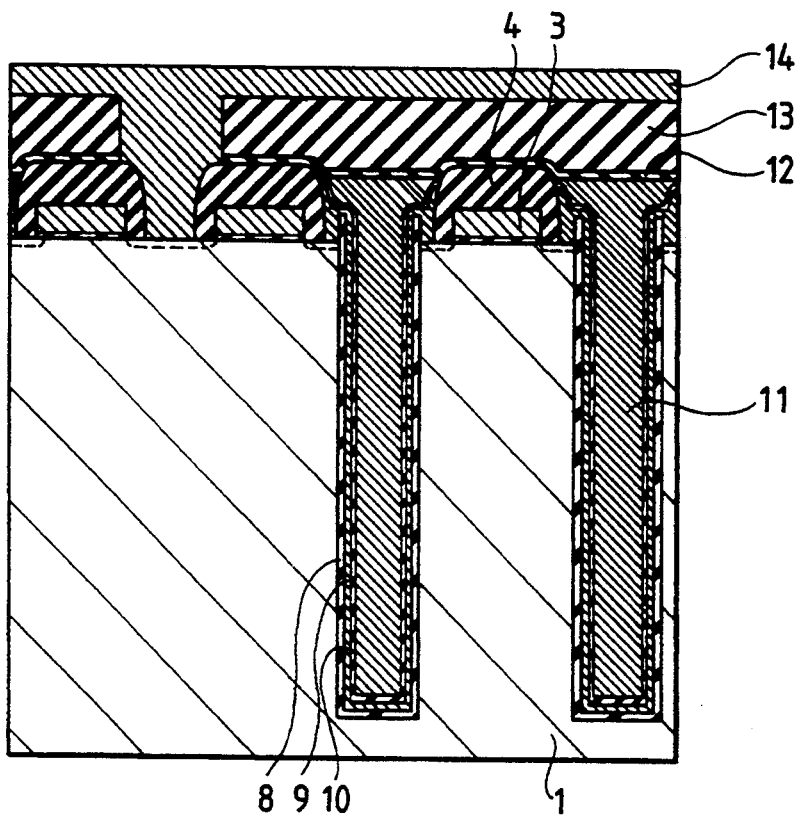

Finally, the silicon nitride film 12 with thickness about 50 nm is formed to the whole surface, and further the interlayer oxide film 13 is deposited by known chemical vapor deposition. Since the memory device has the flat surface, special planarization need not be carried out after forming the interlayer oxide film. Referring to FIG. 20 where a prescribed part of the silicon nitride film 12 and the interlayer oxide film 13 is etched, the bit line contact hole is opened and the bit line 14 is formed. In this embodiment, a tungsten film is used as the bit line 14. The tungsten film can be formed using the chemical vapor deposition, and can fill the contact hole. And then the lining wiring or the like is carried out in order to reduce the resistance of the word line, but the description shall be omitted for its simplification.

Regarding other embodiments, the essential process is the same, and difference is in that, for example, in the embodiment 1, a mask is used for processing the plate electrode, and in the embodiment 2, field isolation domain and arrangement of word line only are different, and in the third embodiment, the same process can be used.

Embodiment 6

In the present invention, since self-align process is used in various positions, the deposited film may remain in some position. For example, regarding separation of polycrystalline silicon being one electrode of the charge storage capacitor, separation can be carried out self-alignedly utilizing height of the word line in the parallel direction to the word line, but separation must be carried out using a mask in the intersection direction to the word line. This will be described using FIG. 21 and so forth.

Figure 21:
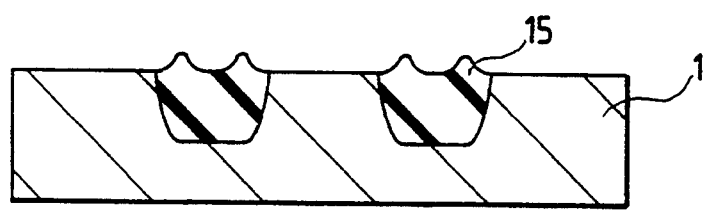

In FIG. 21, state after forming the field isolation oxide 15 to the semiconductor substrate 1 is shown in a section parallel to the word line. In this embodiment, oxide film growth method is adopted where growth of the oxide film in the lateral direction is little. Thickness of the oxide film is about 350 nm.

Figure 22:
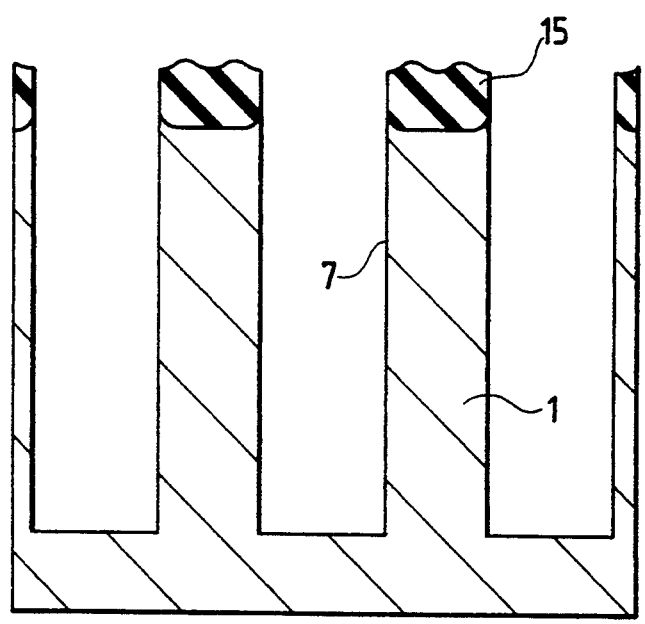
Figure 23:
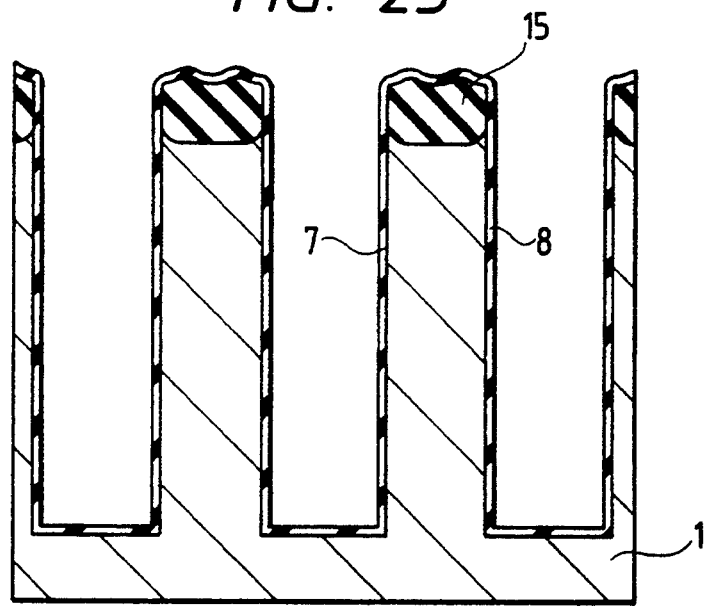
Figure 24:
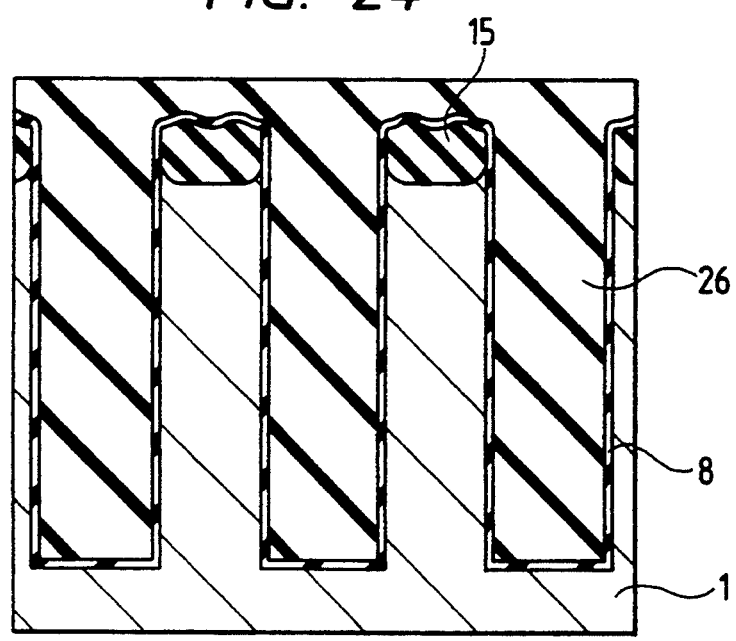
Figure 25:
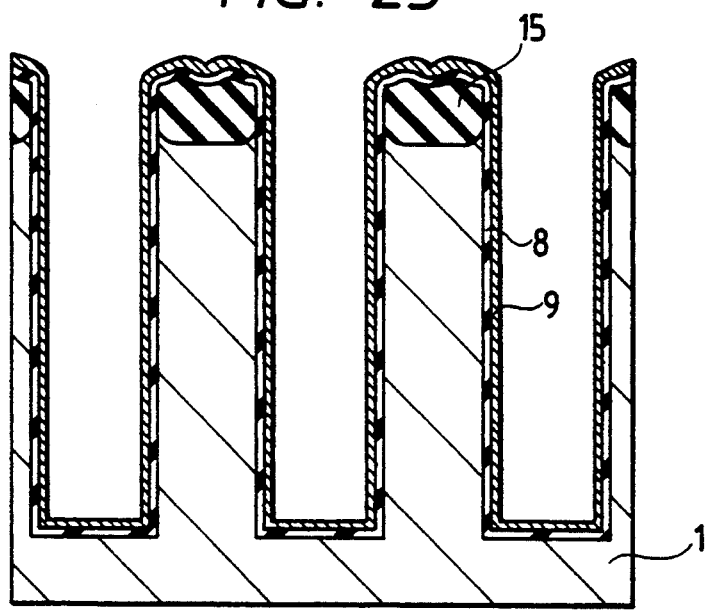
Figure 26:
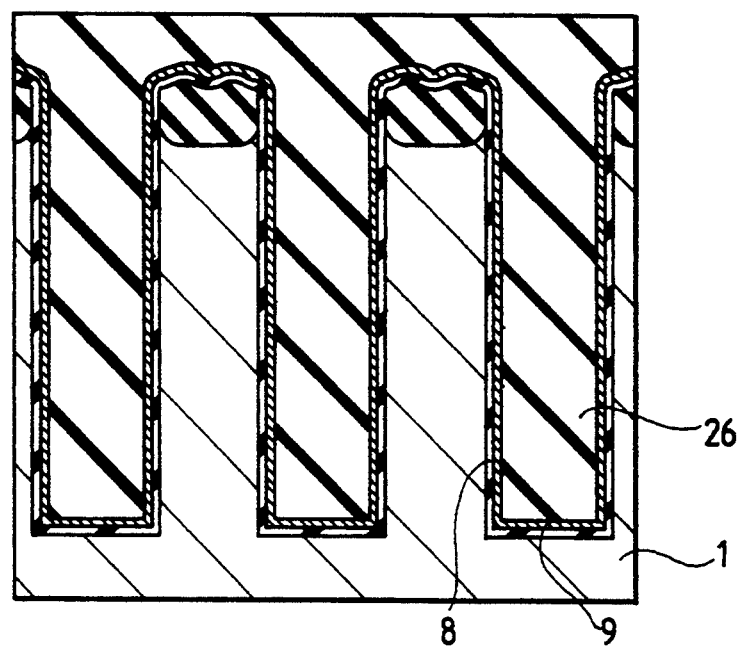
Figure 27:
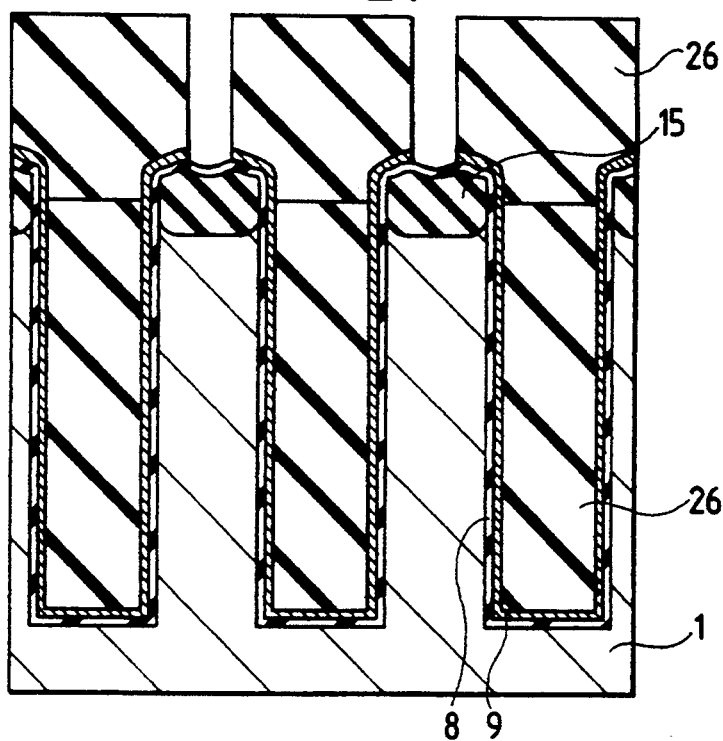
Figure 28:
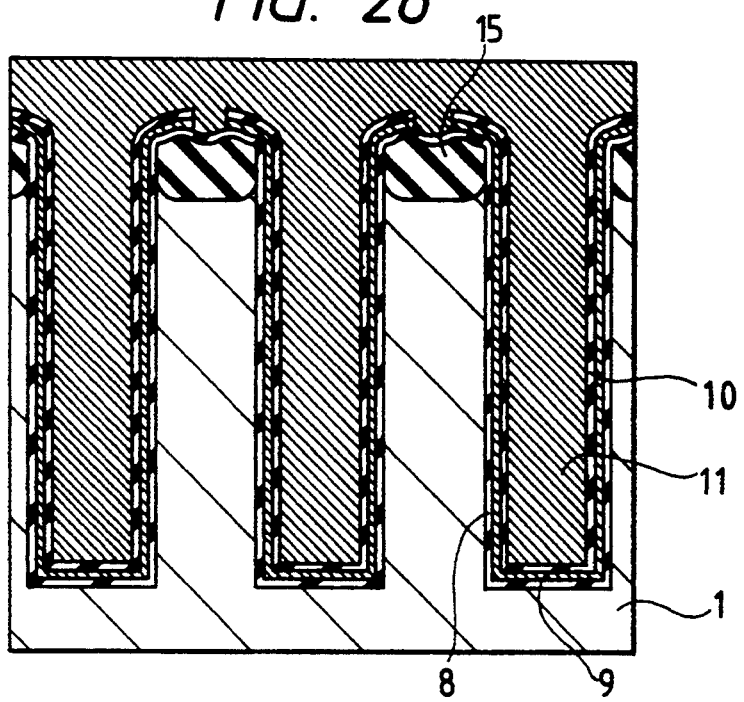
Figure 29:
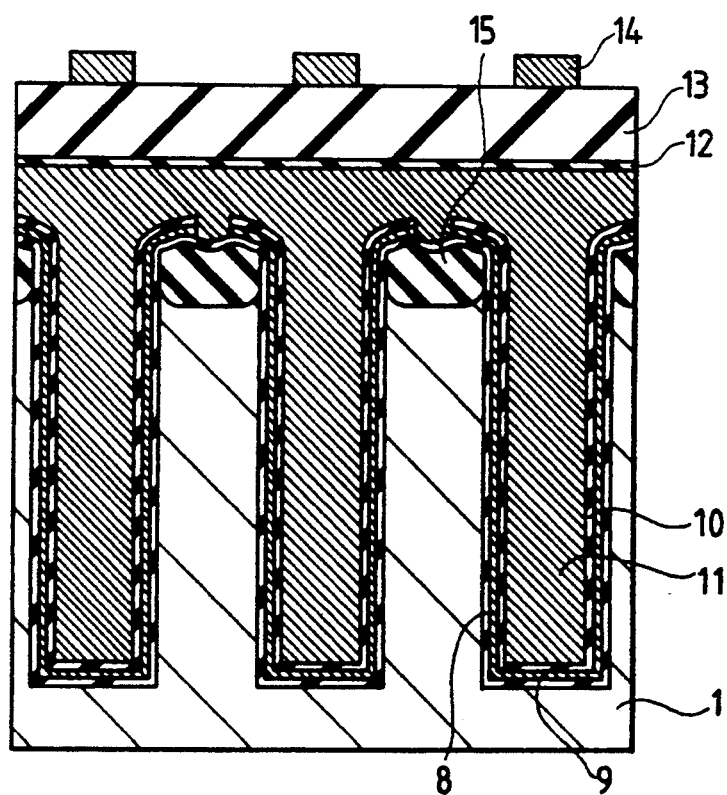

Next, as shown in FIG. 11, if the word line electrode or the like is formed, and using this as a mask, the silicon substrate is etched, in the parallel direction to the word line, as shown in FIG. 22, the field isolation oxide 15 becomes a mask and the substrate being not covered by the word line 3 and the field isolation oxide is etched. Further as shown in FIG. 23, the silicon dioxide film 8 to cover the side wall of the trench is formed. The film thickness or the like is as above described. Next, as shown in FIG. 13, if the inside of the trench is filled by the resist 26 and the all-area etching is carried out so as to expose only the surface portion of the trench side wall silicon dioxide film 8, as shown in FIG. 24, in the section in parallel to the word line, the resist 26 covers the whole surface of the trench side wall silicon dioxide film 8 and therefore the silicon dioxide film 8 is not etched. After removing the resist 26, the polycrystalline silicon film is formed in the inside of the trench as shown in FIG. 25. Further as shown in FIG. 26, the inside of the trench is filled by the organic film 26. This state corresponds to FIG. 16 in the vertical section to the word line. In order to separate the polycrystalline silicon from each other, as shown in FIG. 27, the resist mask 26 is formed and the exposed polycrystalline silicon film 9 is etched. Thus the separation is carried out each other self-alignedly in the parallel direction to the word line, but a mask is necessary in the separation in the vertical direction to the word line. Further as shown in FIG. 28, formation of the capacitor insulation film 10 and the plate electrode 11 and self-align separation thereof are carried out, but the plate electrode is not separated in the section direction. Finally, the silicon nitride film 12, the interlayer oxide film 13 and the bit line 14 are formed as shown in FIG. 29.

Embodiment 7

A transistor in a peripheral circuit can be produced using the nearly same process as the above-mentioned process. This will be described using FIG. 30 and so forth. The film thickness and the forming method of a film to be formed are as above described, and the description shall be omitted here.

Figure 30:
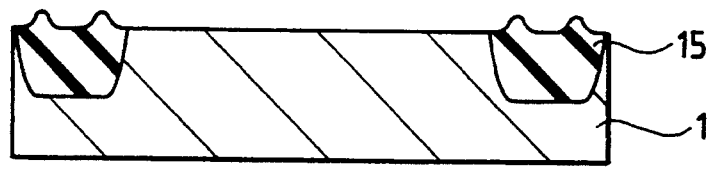
FIGS. 30 to 43 are process diagrams explaining fabricating processes of a peripheral circuit transistor in the invention.
Figure 31:
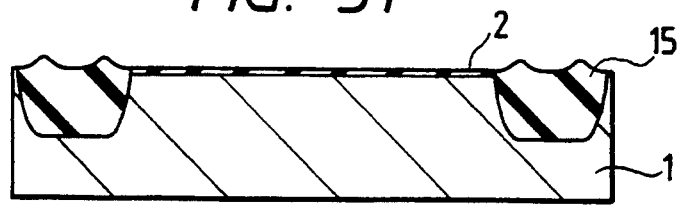
Figure 32:
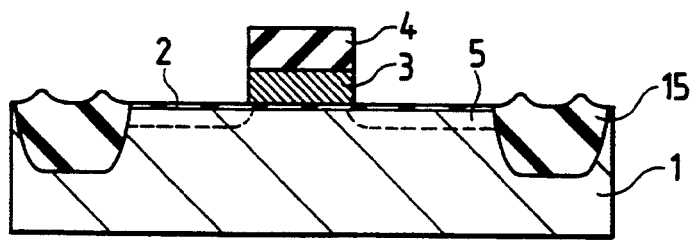
Figure 33:
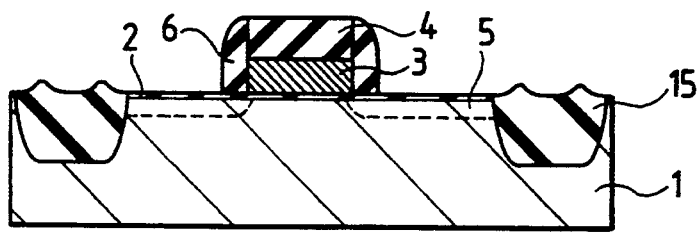
Figure 34:
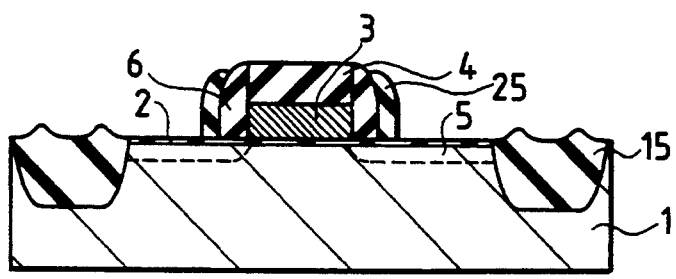
Figure 35:
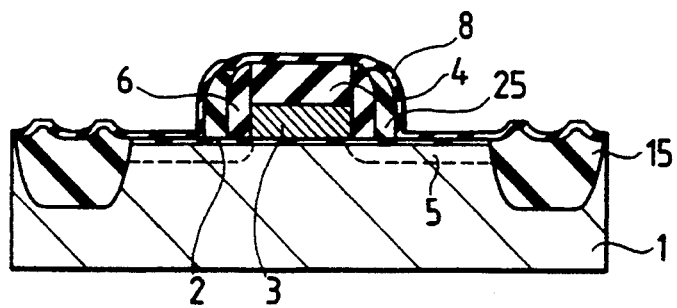
Figure 36:
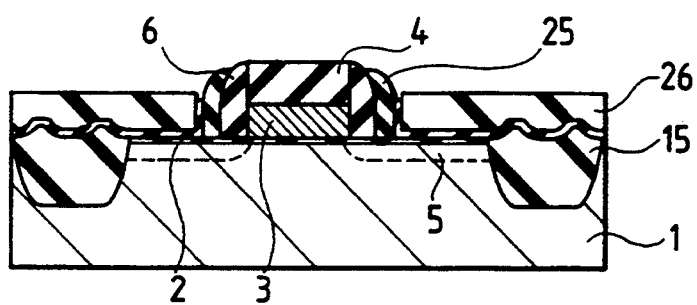
Figure 37:
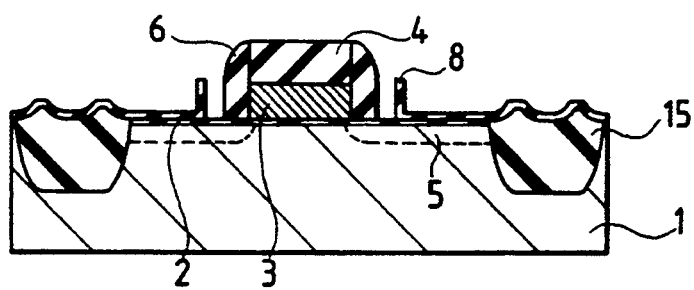
Figure 38:
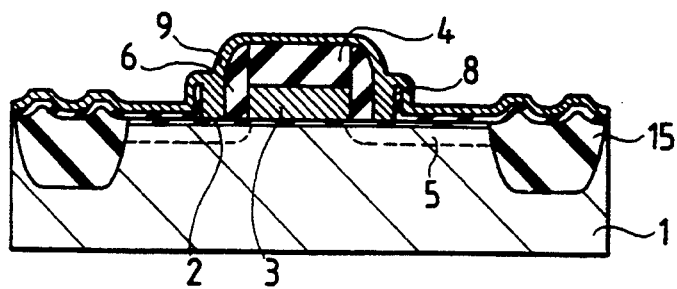
Figure 39:
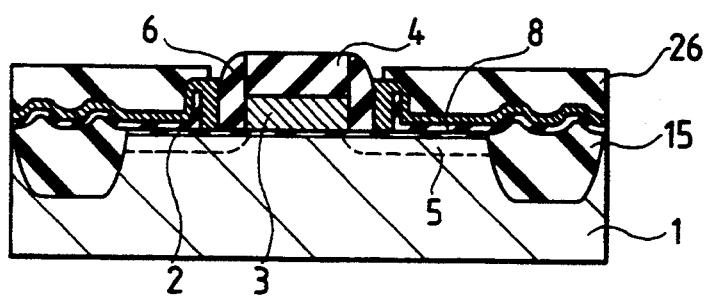
Figure 40:
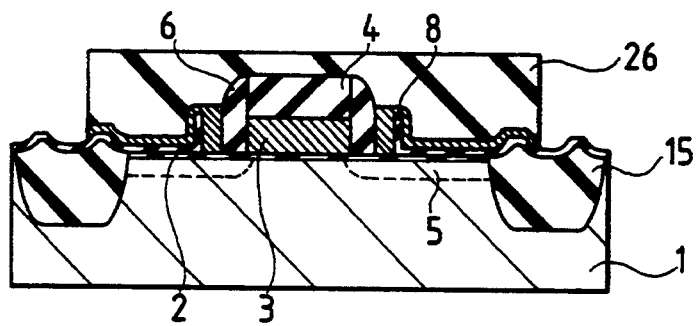
Figure 41:
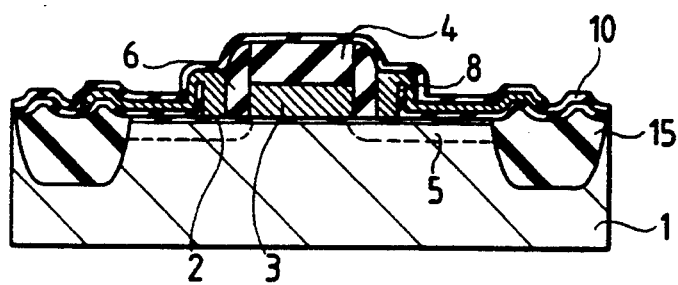
Figure 42:
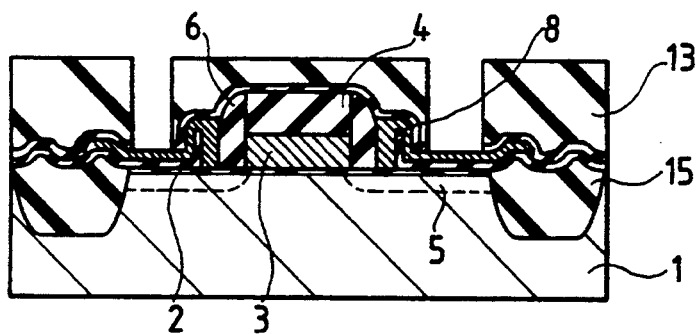
Figure 43:
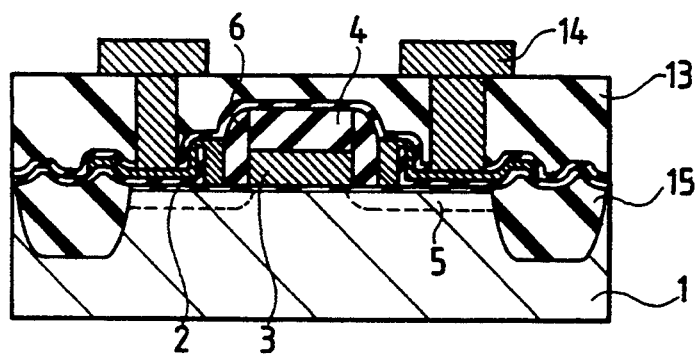
Figure 44:
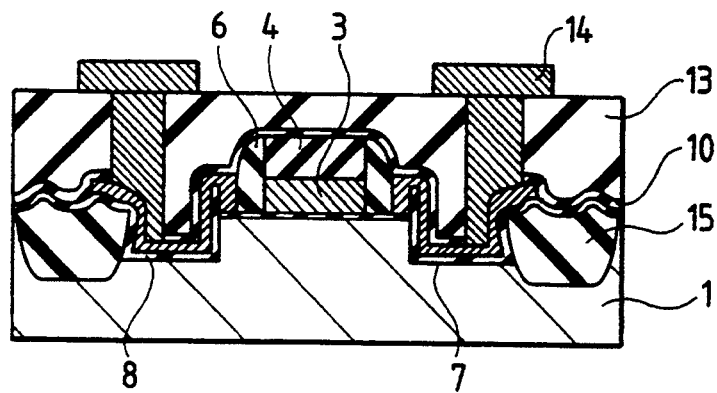
FIGS. 44 and 45 are a sectional view and a plan view of a peripheral circuit transistor in the invention respectively.

First as shown in FIG. 30, the field isolation oxide 15 is formed in the prescribed domain of the substrate 1. Further forming the gate silicon dioxide film 2, a structure shown in FIG. 31 is obtained. Before this process, adjustment of threshold voltage of the transistor and ion implantation to prevent the punch through are carried out, but the description shall be omitted here. Next as shown in FIG. 32, a polycrystalline silicon film including impurity is formed, and further a silicon dioxide film 4 is formed, and then using this as a mask, the polycrystalline silicon film is subjected to patterning and a gate electrode 3 is formed. Using the gate electrode 3 as a mask, impurity being different from the substrate in the conductivity type is implanted and a diffusion layer 5 is formed. In this embodiment, arsenic is implanted. Also silicon dioxide is deposited and anisotropic etching is carried out, and a side wall silicon dioxide film 6 is formed to the side wall of the gate electrode 3. Further as shown in FIG. 34, a side wall silicon nitride film 25 is formed in similar manner. And then, a trench is formed in the memory cell section, and in this case, in the peripheral transistor, this part is covered by the resist film so that the diffusion layer is not etched. Next, if a silicon dioxide film 8 to cover the side wall of the trench is formed, the silicon dioxide film is deposited also on the word electrode and field isolation oxide (FIG. 35). An organic film 26 is coated on the whole surface and subjected to the all-area etching, and the silicon dioxide film on the word electrode is exposed and the exposed portion of the silicon dioxide film is selectively removed, thereby a structure of FIG. 36 is produced. Further as shown in FIG. 37, the side wall silicon nitride film 25 is removed and then the resist mask 26 is removed. As a result, a gap is formed between the side wall silicon dioxide film 6 of the word electrode 3 and the silicon dioxide film 8 projecting upward from the surface of the substrate 1, and the surface of the substrate 1 in the domain interposed between both films is exposed. Next, if the polycrystalline silicon 9 being one electrode of the capacitor is deposited, the polycrystalline silicon 9 fills the gap and is contacted with the substrate as above described (FIG. 38). Further as shown in FIG. 39, the organic film 26 is coated and the all-area etching is carried out, and the polycrystalline film 9 on the word electrode 3 is exposed and the exposed polycrystalline silicon film 9 is removed. Next as shown in FIG. 40, using the resist mask 26, the polycrystalline silicon on the field isolation oxide 15 is separated. This process is the same as the process in producing the trench capacitor that the polycrystalline silicon is etched and isolated from the polycrystalline film of the neighboring element. After this process, in the trench capacitor, the capacitor insulation film 10 and the plate electrode are formed. In the peripheral transistor, however, since the contact to the diffusion layer cannot be taken if there is the plate electrode, the plate electrode must be removed, but since the dry etching selectivity between the polycrystalline silicon and the silicon dioxide film is very high, the capacitor insulation film with thickness of about 5 nm can prevent the polycrystalline silicon from being etched. As a result, a structure shown in FIG. 41 is produced. Then the silicon nitride film 12 and the interlayer oxide film 13 are formed thereon, and the contact is opened (FIG. 44). Finally, a wiring layer 14 is formed (FIG. 43).

FIG. 44 shows the nearly same structure as that of the peripheral transistor described up to now, but when the trench is formed, the diffusion layer part is dug shallow in comparison with the thickness of the field isolation oxide. Thereby the area of the diffusion layer produced within the substrate can be made small, and this is effective for decreasing the diffusion layer capacitor.

Figure 45:
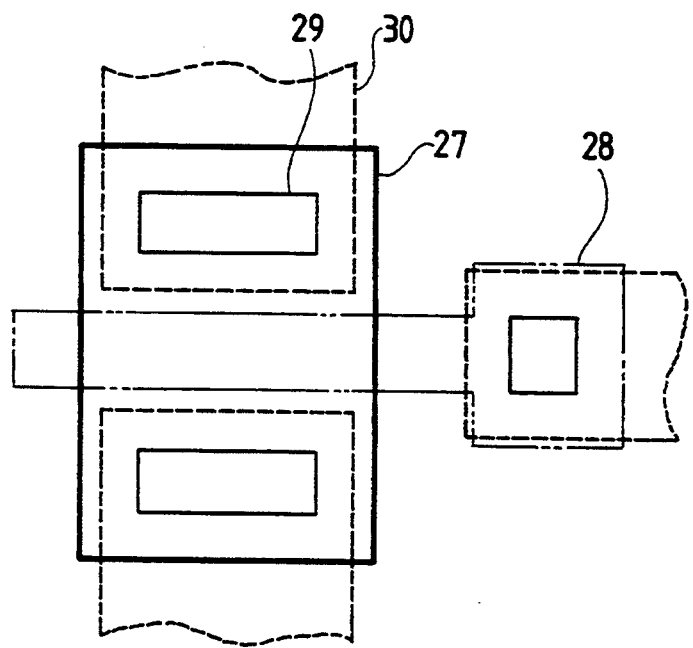

FIG. 45 shows a plan view of the peripheral circuit transistor. This has the nearly same structure as that in the prior art, and further since the diffusion layer can be raised to the field isolation oxide domain using the polycrystalline silicon, the distance between the contact 29 and the field isolation domain 27 can be reduced in comparison to conventional structure. This is effective for reducing the diffusion layer capacitor. In FIG. 45, numeral 28 designates a gate electrode pattern, and numeral 30 designates a wiring pattern respectively.

As already described in the embodiment 5, if the self alignment is used much, the deposited film may remain partially, and in order to remove this, the photoetching using a mask is necessary. Also in the peripheral circuit transistor, in order to separate the polycrystalline silicon being a part of the diffusion layer, such photoetching is necessary. This will be described based on process diagrams showing variation of the planar form in FIG. 46 and so forth.

Figure 46:
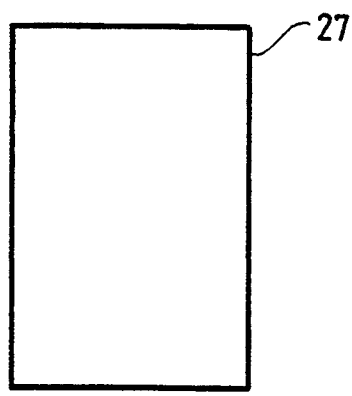
FIGS. 46 to 54 are plan views explaining a fabricating method of a peripheral circuit transistor in the invention.
Figure 47:
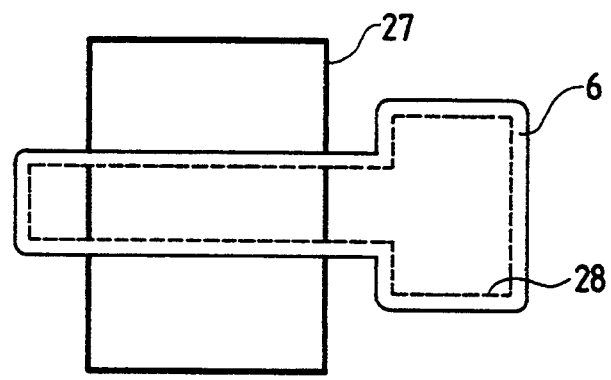
Figure 48:
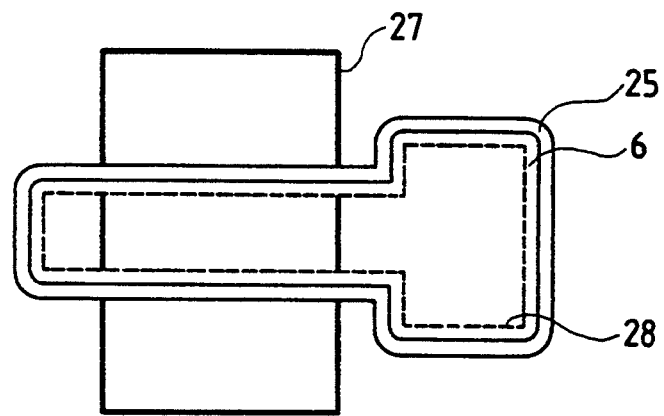
Figure 49:
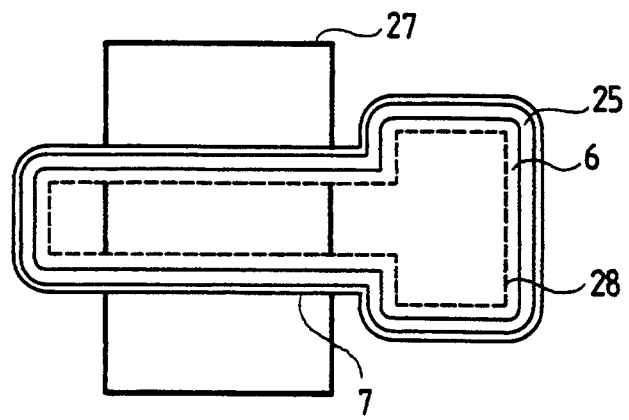
Figure 50:
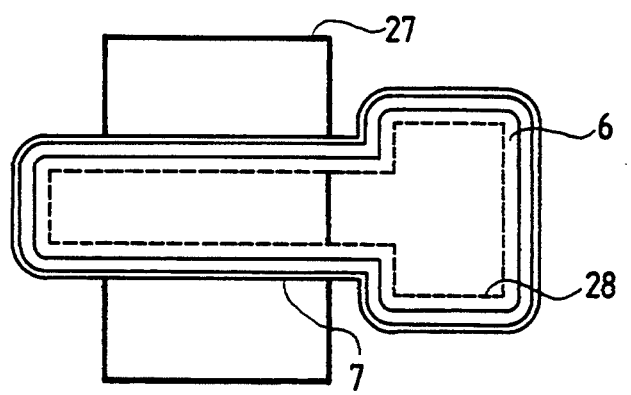
Figure 51:
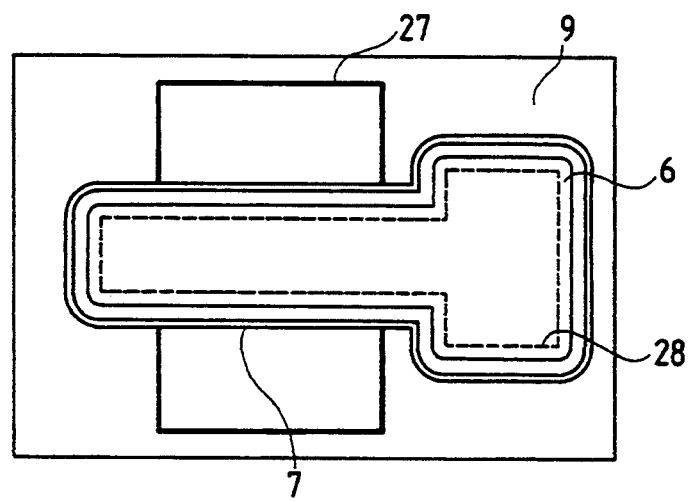
Figure 52:
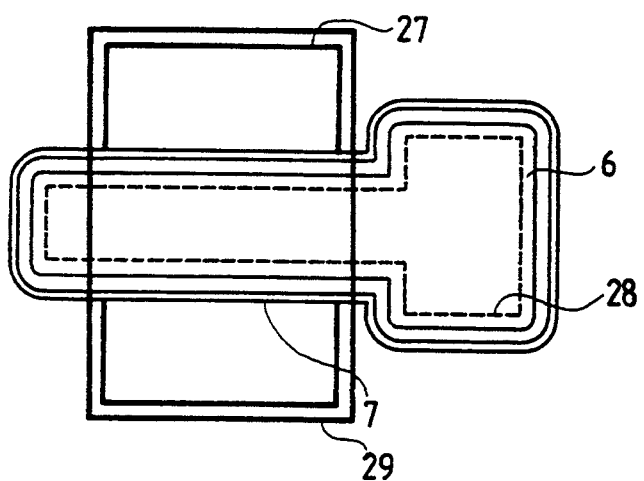
Figure 53:
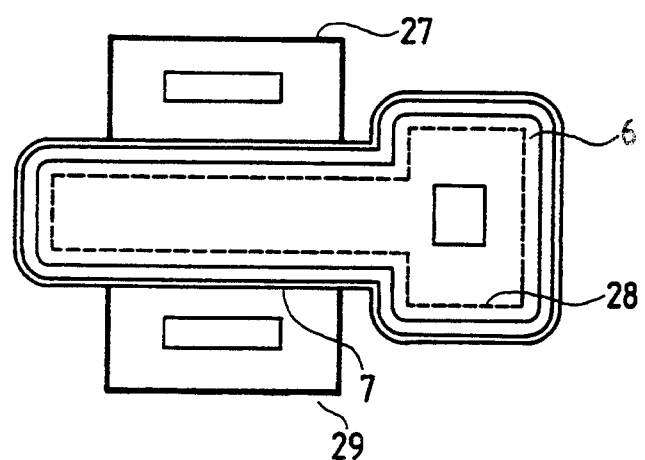
Figure 54:
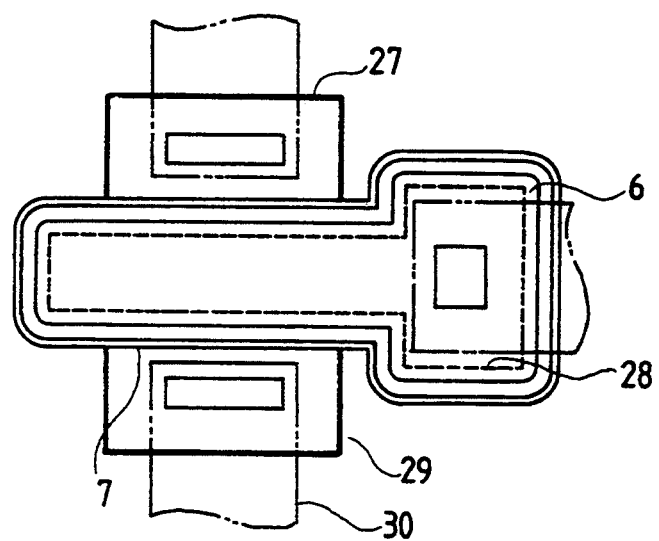

In FIG. 46, numeral 27 designates a pattern for growing the field isolation oxide. Using this pattern 27, if the silicon nitride film on the substrate is processed and oxidation is carried out, the field isolation oxide does not grow in the domain covered by the pattern 27. After the gate silicon dioxide film is grown, the gate electrode is formed using a pattern 28 shown in FIG. 47. The side wall silicon dioxide film 6 is formed to the periphery of the gate electrode using the pattern 28 shown in FIG. 47, and further the side wall silicon nitride film 25 is formed as shown in FIG. 48. As shown in FIG. 49, the silicon dioxide film 7 to cover the side wall of the trench capacitor is formed. As shown in FIG. 50, if the side wall silicon nitride film 25 only is selectively removed, a gap is formed between the side wall silicon dioxide film 6 of the gate electrode and the trench side wall silicon dioxide film 7. After the polycrystalline silicon 9 is deposited thereon, the coating of the resist and the all-area etching are carried out, and the polycrystalline silicon film 9 on the gate electrode is selectively removed as shown in FIG. 51. Further, by the photoetching using a mask, the polycrystalline silicon on both sides of the gate electrode is separated as shown in FIG. 52. The polycrystalline silicon fills the gap and the diffusion layers on both sides of the gate electrode are connected. In order to separate this, the polycrystalline silicon in the gap being not covered by the mask must be removed completely. In this case, since the polycrystalline silicon in the domain to be removed has the ground being the field isolation oxide, there is no fear of the substrate being etched even if the etching of a long time is carried out. Further, as shown in FIG. 53, the contact is opened in the diffusion layer domain and the gate electrode, and as shown in FIG. 54, the wiring is formed and the peripheral circuit transistor is completed.

Although the case of the transistor of one conductivity type only has been described for the simplification, it is needless to say that similar process may be adopted also in the case of a complementary transistor where transistors of different conductivity types are mixed.

According to the present invention, the trench capacitor can be produced very easily in comparison with the memory cell of conventional structure as already described. This is caused by that the capacitor cell in the present invention has symmetric structure. Therefore, the connection process of the diffusion layer of the transistor and one electrode of the capacitor, which is essential in the trench cell in conventional structure, can be carried out self-alignedly. Also if the advantage of the symmetric structure is further developed, the semiconductor memory device to transfer the charge can be constituted, and this may enable further reduction of the cell area in comparison with the memory cell of conventional type. For example, when the design rule of 0.3 microns to realize 64 mega bits is used, the cell area becomes about 1.3 square microns in the memory cell in folded bit-line structure in the prior art, but this can be designed in 0.6 square microns being about a half in the cell of charge transfer type.

Also if every other word line is made the earth potential thereby the channel domain is completely interrupted, the charge storage capacitors on both sides of the word line can be separated electrically. If the constitution of the charge transfer type is not made as above described, the field isolation by the word line can be carried out in such manner and this is suitable to reduce the field isolation area.

Further, since the diffusion layer of the transistor and the electrode of the capacitor can be connected in self alignment, this is effective to reduce the area of the diffusion layer of the transistor. As a result, advantages are in that soft-error immunity is large, and the leak current caused by the junction is little. In addition, since the transistor in the periphery circuit can be also produced using the nearly same process, the memory cell transistor and the peripheral transistor can be produced in the same process similarly to the memory device in the prior art. Further, according to the present invention, the peripheral circuit transistor can reduce the area of the diffusion layer, and using the polycrystalline silicon as a part of the diffusion layer, resistance of the diffusion layer can be reduced. These advantages can contribute to the improvement of performance of the transistor significantly.

What is claimed is:

1. A method for fabricating a semiconductor memory device comprising:
    step of forming at least one gate electrode onto a main surface of a semiconductor substrate through a gate insulating film;
    step of forming a first insulation film to cover a side wall and an upper surface of said at least one gate electrode;
    step of forming a second insulation film overlying the main surface;
    step of applying anisotropic etching to said second insulation film and leaving a part formed on the side wall of said at least one gate electrode and removing a part formed on other domain, whereby an exposed part of the semiconductor substrate is provided;
    step of applying anisotropic etching to the exposed part of said semiconductor substrate and forming at least one trench, each trench having an inner surface;
    step of forming a third insulation film, by chemical vapor deposition, at least on the inner surface of each trench;
    step of removing said second insulation film, so as to provide an exposed surface of the semiconductor substrate; and
    step of forming a conductive film extending from said third insulation film within each trench to the exposed surface of said semiconductor substrate.

2. A method for fabricating a semiconductor memory device as set forth in claim 1, wherein said third insulation film is formed by depositing a layer of material of the third insulation film, by chemical vapor deposition, on the inner surface of each trench and overlying the semiconductor substrate, and selectively removing the layer of material of the third insulation film so as to form said third insulation film.

3. A method for fabricating a semiconductor memory device as set forth in claim 2, wherein said layer of material of the third insulation film is formed over an entirety of the main surface of the semiconductor substrate, and wherein said selectively removing the layer of material of the third insulation film is performed by anisotropic etching.

4. A method for fabricating a semiconductor memory device as set forth in claim 2, wherein the semiconductor substrate is of a first conductivity type, and the method includes a further step of forming diffusion layers in surface regions of the semiconductor substrate, the diffusion layers being of a second conductivity type opposite to the first conductivity type; wherein the exposed surface of the semiconductor substrate, provided by the anisotropic etching applied to the second insulation film, includes the diffusion layers; and wherein the conductive film is formed to extend to the diffusion layers.

5. A method for fabricating a semiconductor memory device as set forth in claim 4, wherein a plurality of gate electrodes are formed onto a main surface of the semiconductor substrate through the gate insulation film.

6. A method for fabricating a semiconductor memory device as set forth in claim 5, wherein the step of applying anisotropic etching to the exposed part of the semiconductor substrate is performed such that the diffusion layers extend at opposed sides of each trench; and wherein the conductive film is formed to extend to the diffusion layers at both of the opposed sides of each trench.

7. A method for fabricating a semiconductor memory device as set forth in claim 4, wherein said conductive film is a polycrystalline silicon film.

8. A method for fabricating a semiconductor memory device as set forth in claim 7, wherein said polycrystalline silicon film is of said second conductivity type.

9. A method for fabricating a semiconductor memory device as set forth in claim 1, wherein said first insulation film comprises a silicon dioxide film.

10. A method for fabricating a semiconductor memory device as set forth in claim 1, wherein said second insulation film comprises a silicon nitride film.

11. A method for fabricating a semiconductor memory device as set forth in claim 1, wherein the step of forming the third insulation film includes anisotropically etching a layer of material of the third insulating film, and wherein said anisotropically etching the layer of material of said third insulation film is carried out so as to protrude said third insulating film from the main surface of said semiconductor substrate.

12. A method for fabricating a semiconductor memory device as set forth in claim 11, wherein prior to said step of anisotropically etching material of said third insulation film, said trench is filled with an organic layer so as to protrude from the main surface of said semiconductor substrate.

13. A method for fabricating a semiconductor memory device as set forth in claim 1, wherein said third insulation film is formed so as to protrude from the main surface of the semiconductor substrate and to be spaced from the first insulation film in a direction along the main surface of the semiconductor substrate.

14. A method for fabricating a semiconductor memory device as set forth in claim 1, wherein the conductive film extends along the third insulation film on the inner surface of each trench, and wherein the method includes further steps of forming a dielectric film on the conductive film on the inner surface of each trench, and forming a conductive plate on the dielectric film in each trench, so as to form a capacitor in each trench.

15. A method for fabricating a semiconductor memory device as set forth in claim 14, wherein a plurality of trenches are formed, and wherein the conductive plate formed in each trench is separated from conductive plates in other trenches.

16. A method for fabricating a semiconductor memory device as set forth in claim 14, wherein the at least one gate electrode includes a gate electrode of a switching MISFET of the semiconductor memory device, and wherein diffusion layers form the exposed surface of the semiconductor substrate, the diffusion layers being source or drain regions of the switching MISFET.

17. A method for fabricating a semiconductor memory device comprising:
- step of forming at least one gate electrode onto a main surface of a semiconductor substrate through a gate insulation film, the substrate being of a first conductivity type;
- step of forming diffusion layers, having a second conductivity type opposite to the first conductivity type, in surface regions of the semiconductor substrate;
- step of forming a first insulation film to cover side walls and an upper surface of the at least one gate electrode;
- step of forming a second insulation film on the side walls of the at least one gate electrode, the diffusion layers being exposed through the second insulation film;
- step of applying anisotropic etching to the diffusion layers exposed through the second insulation film, so as to form at least one trench, the anisotropic etching being performed such that a remaining portion of the diffusion layers extends from both of opposed sides of each trench;
- step of forming a third insulation film on inner surfaces of each trench;
- step of removing said second insulation film, so as to expose the diffusion layers; and
- step of forming a conductive film extending from said third insulation film within the trench to exposed diffusion layers.

18. A method for fabricating a semiconductor memory device as set forth in claim 17, wherein the step of forming the conductive film includes extending the conductive film to the exposed diffusion layers at both of the opposed sides of each trench.

* * * * *